United States Patent
Huang

(10) Patent No.: US 8,105,941 B2
(45) Date of Patent: Jan. 31, 2012

(54) THROUGH-WAFER INTERCONNECTION

(75) Inventor: Yongli Huang, San Jose, CA (US)

(73) Assignee: Kolo Technologies, Inc., San Jose, CA (US)

( * ) Notice: Subject to any disclaimer, the term of this patent is extended or adjusted under 35 U.S.C. 154(b) by 734 days.

(21) Appl. No.: 11/914,584

(22) PCT Filed: May 18, 2006

(86) PCT No.: PCT/IB2006/051566
§ 371 (c)(1),
(2), (4) Date: Nov. 16, 2007

(87) PCT Pub. No.: WO2006/123298
PCT Pub. Date: Nov. 23, 2006

(65) Prior Publication Data
US 2008/0203556 A1    Aug. 28, 2008

Related U.S. Application Data

(60) Provisional application No. 60/682,619, filed on May 18, 2005.

(51) Int. Cl.
*H01L 21/4763* (2006.01)

(52) U.S. Cl. ............... 438/638; 438/639; 257/E21.577; 257/E21.585

(58) Field of Classification Search .................. 438/638, 438/639; 257/E21.577, E21.585
See application file for complete search history.

(56) References Cited

U.S. PATENT DOCUMENTS

| | | | |
|---|---|---|---|
| 2,975,307 A | 3/1961 | Schroeder et al. | |
| 4,889,832 A * | 12/1989 | Chatterjee | 438/270 |
| 4,996,627 A * | 2/1991 | Zias et al. | 361/283.4 |
| 5,055,731 A | 10/1991 | Nihei et al. | |
| 5,894,452 A | 4/1999 | Ladabaum et al. | |
| 5,993,677 A * | 11/1999 | Biasse et al. | 216/36 |
| 6,002,117 A | 12/1999 | Pak | |
| 6,004,832 A | 12/1999 | Haller et al. | |
| 6,283,601 B1 | 9/2001 | Hagelin et al. | |
| 6,512,625 B2 | 1/2003 | Mei et al. | |

(Continued)

FOREIGN PATENT DOCUMENTS

EP    1306901 A2    5/2003

(Continued)

OTHER PUBLICATIONS

Chow et al, "Process Compatible Polysilicon-Based Electrical Through-Wafer Interconnects in Silicon Substrates," Journal of Electromechanical Systems, IEEE, vol. 11, No. 6, Dec. 2002, pp. 631-640.

(Continued)

*Primary Examiner* — Jarrett Stark
(74) *Attorney, Agent, or Firm* — Lee & Hayes, PLLC

(57) ABSTRACT

A through-wafer interconnect and a method for fabricating the same are disclosed. The method starts with a conductive wafer to form a patterned trench by removing material of the conductive wafer. The patterned trench extends in depth from the front side to the backside of the wafer, and has an annular opening generally dividing the conductive wafer into an inner portion and an outer portion whereby the inner portion of the conductive wafer is insulated from the outer portion and serves as a through-wafer conductor. A dielectric material is formed or added into the patterned trench mechanical to support and electrically insulate the through-wafer conductor. Multiple conductors can be formed in an array.

64 Claims, 21 Drawing Sheets

U.S. PATENT DOCUMENTS

| | | | |
|---|---|---|---|
| 6,585,653 | B2 | 7/2003 | Miller |
| 6,600,587 | B2 | 7/2003 | Sniegowski et al. |
| 6,605,518 | B1 * | 8/2003 | Ohmi et al. ............... 438/458 |
| 6,684,469 | B2 | 2/2004 | Horning et al. |
| 6,828,656 | B2 * | 12/2004 | Forbes et al. ............... 257/621 |
| 6,865,140 | B2 | 3/2005 | Thomenius et al. |
| 7,052,464 | B2 | 5/2006 | Wodnicki |
| 7,564,172 | B1 | 7/2009 | Huang |
| 2002/0031294 | A1 | 3/2002 | Takeda et al. |
| 2002/0074670 | A1 | 6/2002 | Suga |
| 2003/0022475 | A1 * | 1/2003 | Vieux-Rochaz et al. ..... 438/598 |
| 2003/0207566 | A1 * | 11/2003 | Forbes et al. ............... 438/667 |
| 2003/0222354 | A1 * | 12/2003 | Mastromatteo et al. ...... 257/774 |
| 2004/0027671 | A1 | 2/2004 | Wu et al. |
| 2004/0085858 | A1 | 5/2004 | Khuri-Yakub et al. |
| 2004/0106221 | A1 | 6/2004 | Hunter et al. |
| 2005/0046922 | A1 | 3/2005 | Lin et al. |
| 2005/0075572 | A1 | 4/2005 | Mills et al. |
| 2005/0168849 | A1 | 8/2005 | Lin |
| 2005/0237858 | A1 | 10/2005 | Thomenius et al. |
| 2006/0004289 | A1 | 1/2006 | Tian et al. |
| 2006/0125348 | A1 | 6/2006 | Smith et al. |
| 2008/0194053 | A1 | 8/2008 | Huang |
| 2008/0197751 | A1 | 8/2008 | Huang |
| 2008/0290756 | A1 | 11/2008 | Huang |
| 2009/0140606 | A1 | 6/2009 | Huang |

FOREIGN PATENT DOCUMENTS

| | | |
|---|---|---|
| JP | 2000508860 | 7/2000 |
| JP | 2002191180 | 7/2002 |
| JP | 2002250665 | 9/2002 |
| JP | 2005078068 | 3/2005 |
| WO | WO2004084300 A1 | 9/2004 |
| WO | WO20050120130 A1 | 12/2005 |

OTHER PUBLICATIONS

Lemmerhirt et al, "Air-Isolated Through-Wafer Interconnects for Microsystem Applications," The 12th International Conference on Solid State Sensors, Actuators and Microsystems, IEEE, Jun. 6-12, 2003, pp. 1067-1070.

Huang et al, "Fabricating Capacitive Micromachined Ultrasonic Transducers with Wafer-Bonding Technology," Journal of Microelectromechanical Systems, IEEE, vol. 12, No. 2, Apr. 2003, pp. 128-137.

Ergun et al, "Capacitive Micromachined Ultrasonic Transducers: Fabrication Technology," IEEE Transactions on Ultrasonics, Ferroelectrics, and Frequency Control, vol. 52, No. 12, Dec. 2005, pp. 2242-2258.

Jin et al, "Micromachined Capacitive Transducer Arrays for Medical Ultrasound Imaging," 1998 IEEE Ultrasonics Symposium, pp. 1877-1880.

Jin et al, "Recent Progress in Capacitive Micromachined Ultrasonic Immersion Transducer Array," The 8th International Symposium on Integrated Circuits, Devices and Systems, Singapore, Sep. 8-10, 1999, pp. 159-162.

Douglass et al, "Why is the Texas Instruments Digital Micromirror Device(TM) (DMD(TM)) so Reliable?", 1997, 7 pgs.

Hornbeck et al, "Digital Light Processing and MEMS: Timely Convergence for a Bright Future," DLP—Digital Light Processing, 1995, 25 pgs.

Huang et al, "Capacitive Micromachined Ultrasonic Transducers (CMUTS) with Isolation Posts," 2004 IEEE International Ultrasonics, Ferroelectrics, and Frequency Control Joint 50th Anniversary Conference, pp. 2223-2226.

Huang et al, "New Fabrication Process for Capacitive Micromachined Ultrasonic Transducers," IEEE, 2003, pp. 522-525.

Huang et al, "Optimized Membrane Configuration Improves CMUT Performance," 2004 IEEE Ultrasonics Symposium, 2004 IEEE International Ultrasonics, Ferroelectrics, and Frequency Control Joint 50th Anniversary Conference, pp. 505-508.

Hwang et al, "Design and Fabrication of the Thin-Film Micromirror Array-actuated for Large Projection Displays," Journal of the Korean Physical Society, vol. 33, Nov. 1998, pp. S467-S470.

Jeon et al, "Electrostatic Digital Micromirror Using Interdigitated Cantilevers," IEEE, 2002, pp. 528-531.

Khuri-Yakub et al, "Micromachined Ultrasonic Transducers and Their Use for 2D and 3D Imaging," Acoustical Imaging, Kluwer Academic Publishers, Netherlands, 2004, pp. 1-9.

Kim et al, "A High Fill-Factor Micro-Mirror Stacked on a Crossbar Torsion Spring for Electrostatically-Actuated Two-Axis Operation in Large-Scale Optical Switch," IEEE, 2003, pp. 259-262.

Zhou et al, "Two-Axis Scanning Mirror for Free-Space Optical Communication between UAVs," IEEE/LEOS Optical MEMS 2003, Hawaii, US, Aug. 2003, pp. 1-2.

Huang et al, "Capacitive Micromachined Ultrasonic Transducers (CMUTS) with Piston-Shaped Membranes," 2005 IEEE Ultrasonics Symposium, 2005, pp. 589-592.

PCT International Search Report and Written Opinion for PCT Application No. PCT/IB06/51567, mailed on Jun. 5, 2008, 7 pgs.

PCT International Search Report and Written Opinion for PCT Application No. PCT/IB06/51568, mailed on Jun. 16, 2008, 7 pgs.

PCT International Search Report and Written Opinion for PCT Application No. PCT/IB06/51569, mailed on Jun. 18, 2008, 7 pgs.

PCT International Search Report and Written Opinion for PCT Application No. PCT/IB06/51948, mailed on Jul. 7, 2008, 9 pgs.

Extended Europoean Search Report mailed on Feb. 18, 2011 for European Patent Application No. 06744966.0, a counterpart foreign application for U.S. Appl. No. 11/914,584, 16 pgs.

Translated the Chinese Office Action mailed Mar. 23, 2011 for Chinese Patent Application No. 200680017137.1, a counterpart foreign application of U.S. Appl. No. 11/914,597.

The Chinese Office Action mailed Jun. 28, 2011 for Chinese patent application No. 200680025783.2, a counterpart foreign application of U.S. Appl. No. 11/914,584.

Final Office Action for U.S. Appl. No. 11/917,666 mailed on Apr. 25, 2011, Yongli Huang, "Micro-Electro-Mechanical Transducer Having an Insulation Extension".

Translated copy of the Japanese Office Action mailed Jul. 8, 2011 for Japanese patent application No. 2008-511848, a counterpart foreign application of U.S. Appl. No. 11/914,597.

Non-Final Office Action for U.S. Appl. No. 11/914,584 mailed on Apr. 25, 2011, Yongli Huang, "Through-Wafer Interconnection".

Office action for U.S. Appl. No. 11/914,608, mailed on Aug. 4, 2011, Huang, "Micro-Electro-Mechanical Transducers", 8 pages.

Chinese Office Action mailed Nov. 14, 2011 for Chinese patent application No. 200680025783.2, a counterpart foreign application of U.S. Appl. No. 11/914,584, 11 pages.

Japanese Office Action mailed Oct. 21, 2011 for Japanese patent application No. 2008-516496, a counterpart foreign application of U.S. Appl. No. 11/917,666, 6 pages.

Non-Final Office Action for U.S. Appl. No. 11/914,597, mailed on Nov. 4, 2011, Yongli Huang, "Micro-Electro-Mechanical Transducers", 21 pages.

* cited by examiner

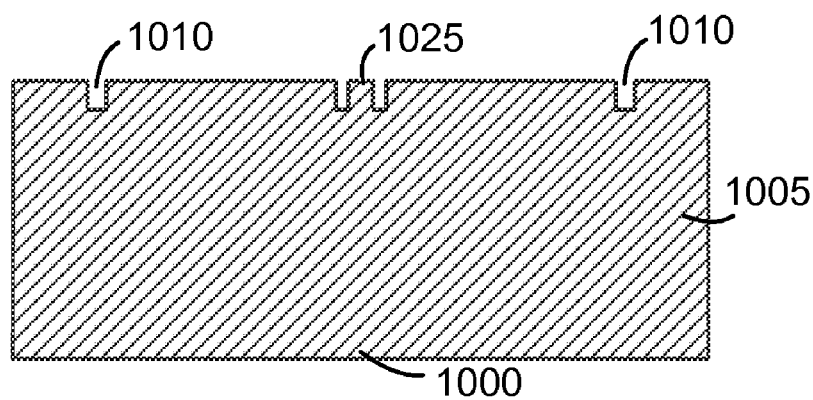
FIG. 10.1
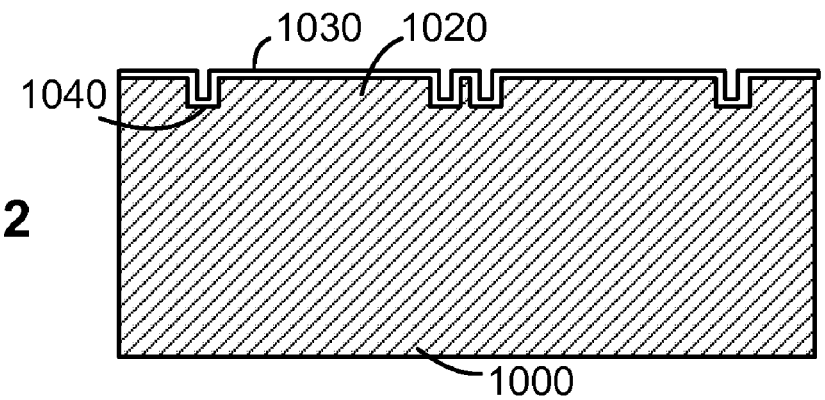
FIG. 10.2
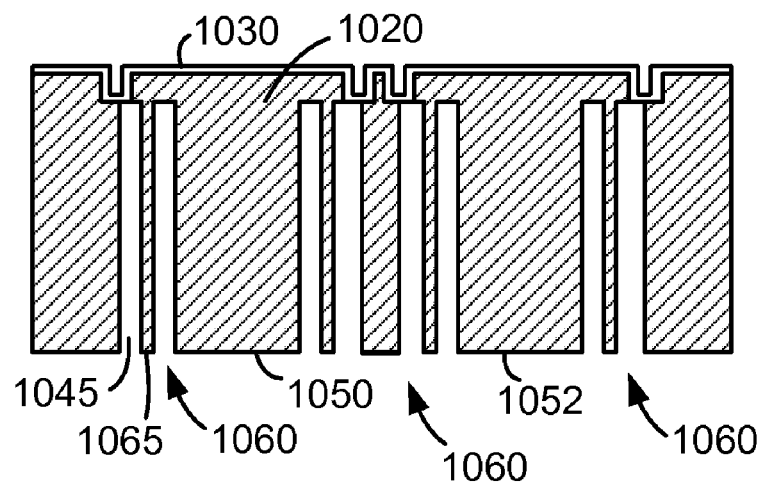
FIG. 10.3

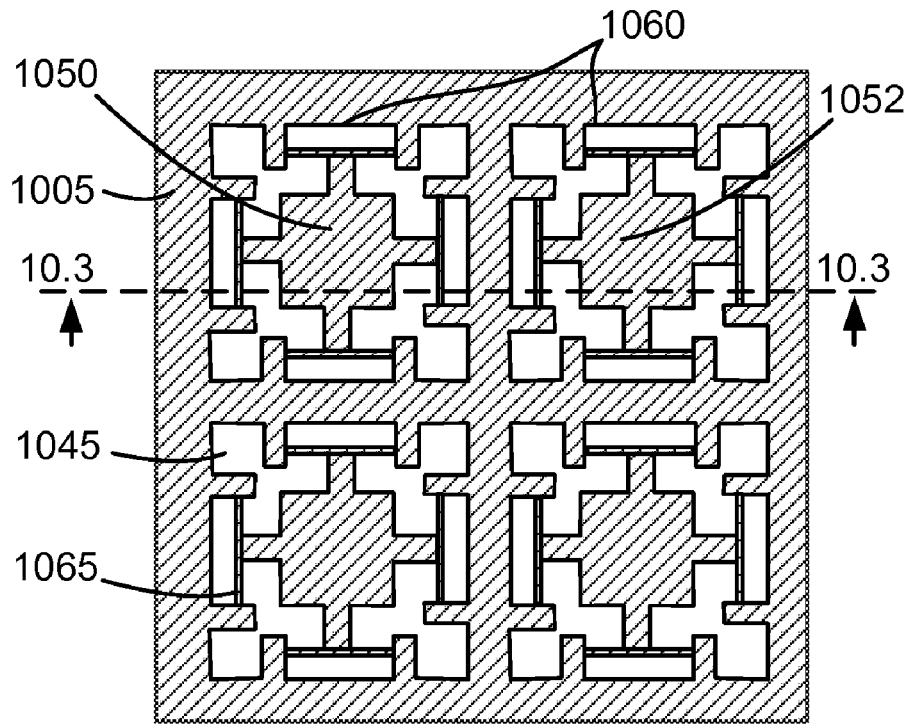
FIG. 10.3B
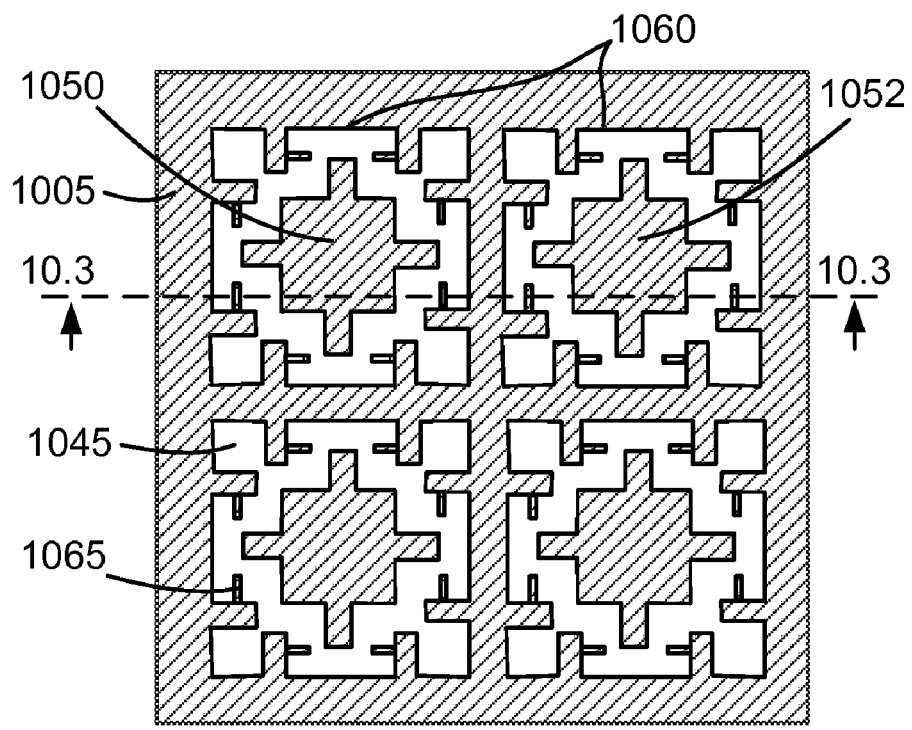
FIG. 10.3C

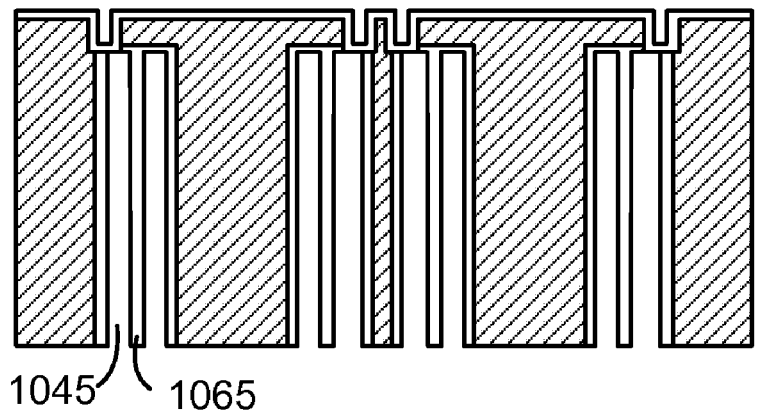
FIG. 10.4
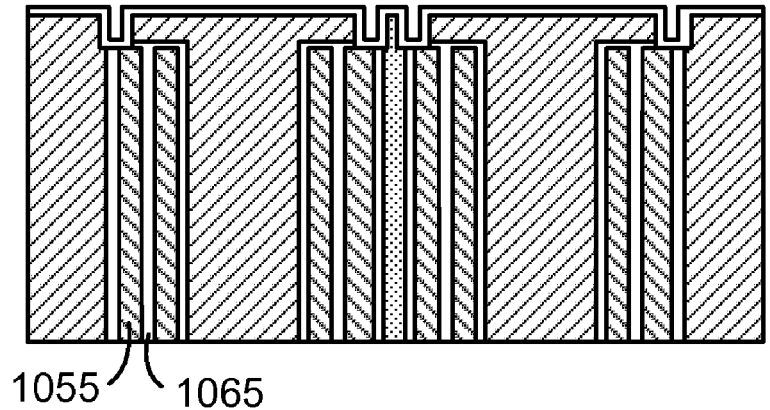
FIG. 10.5
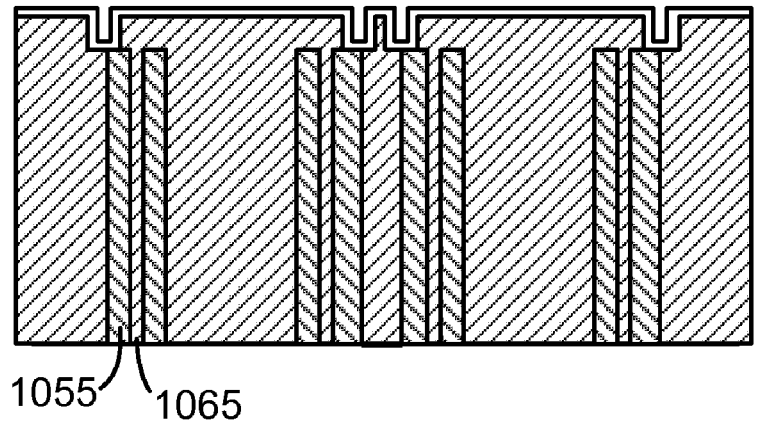
FIG. 10.4A

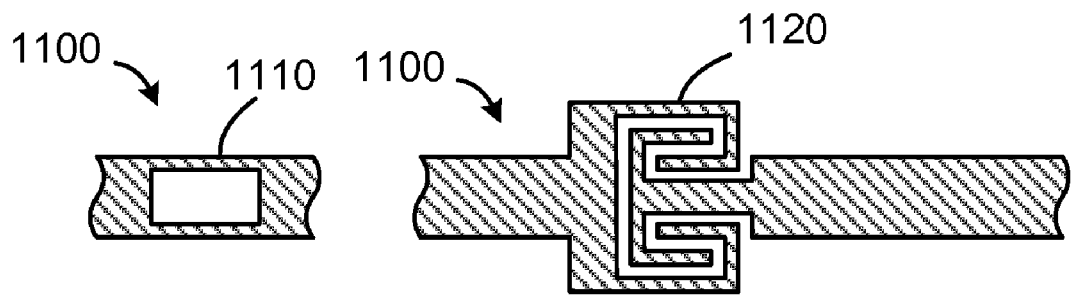
FIG. 11.1
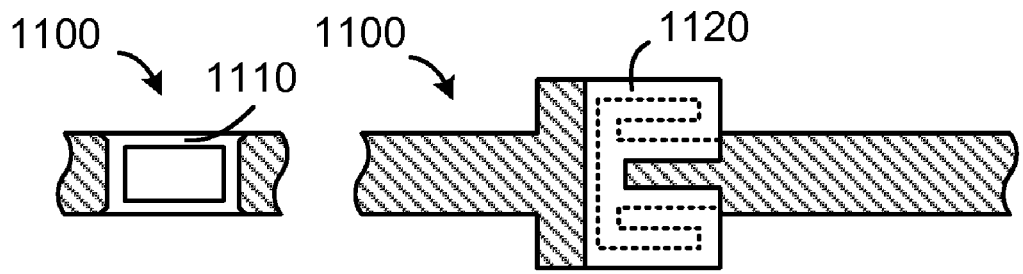
FIG. 11.2
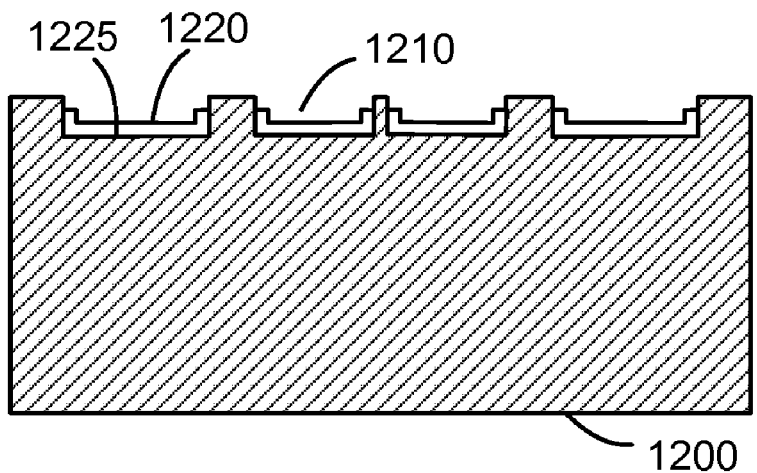
FIG. 12.1

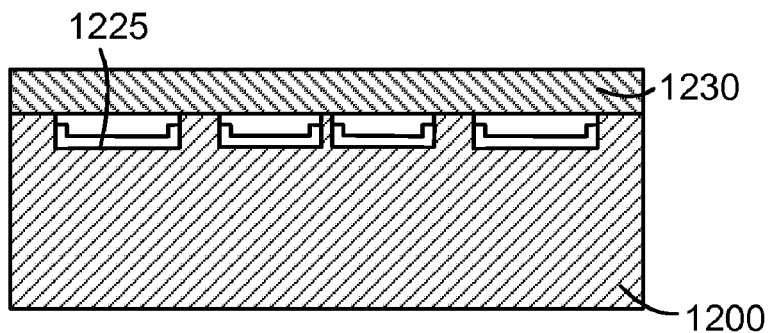
FIG. 12.2
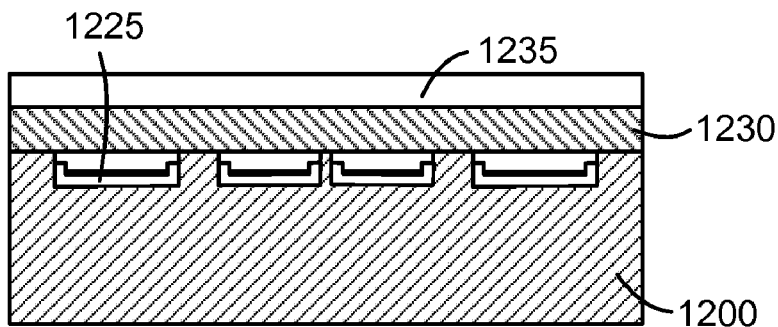
FIG. 12.3
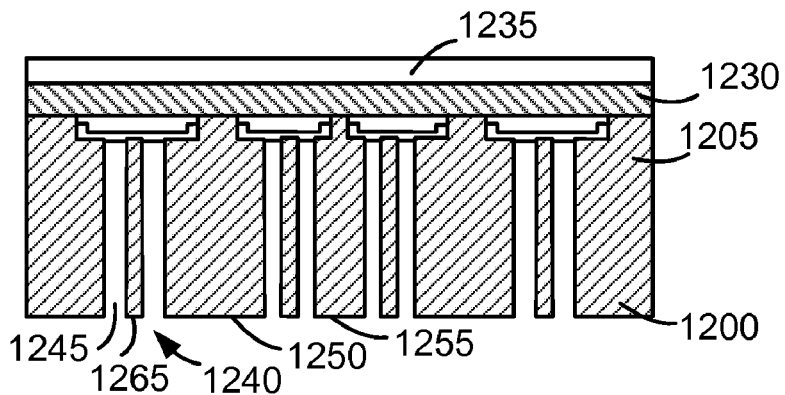
FIG. 12.4
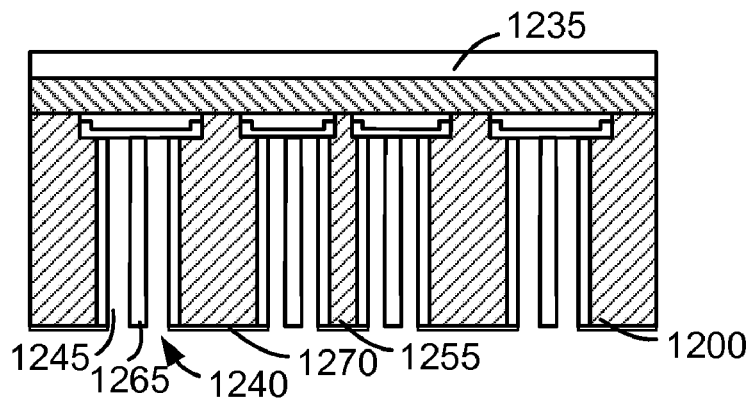
FIG. 12.5

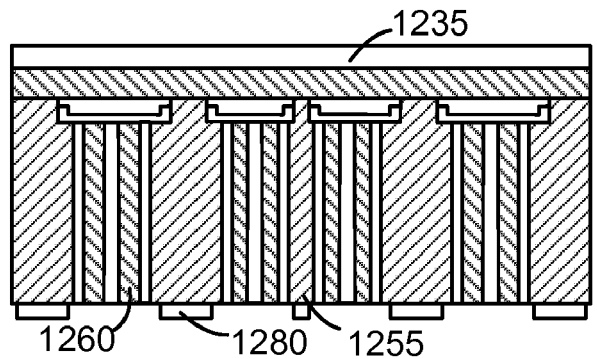
FIG. 12.6
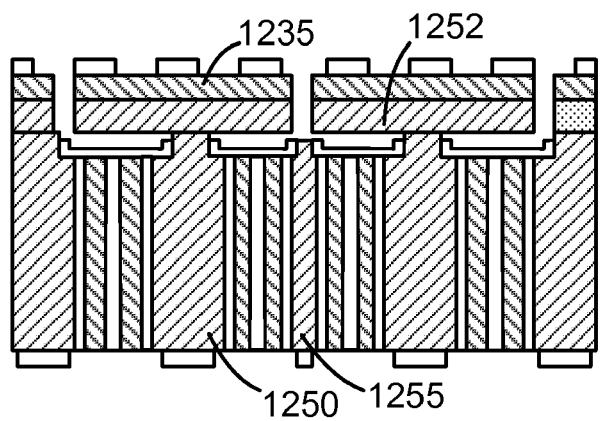
FIG. 12.7
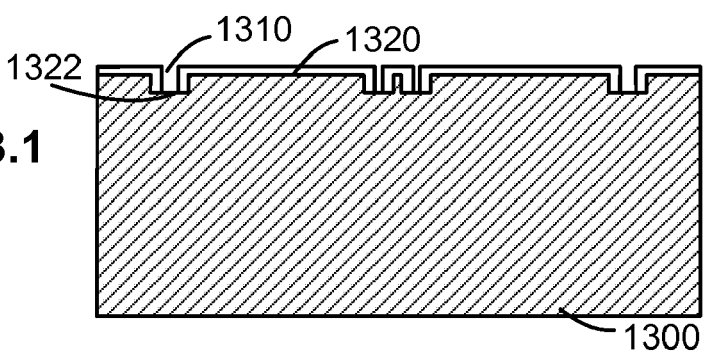
FIG. 13.1
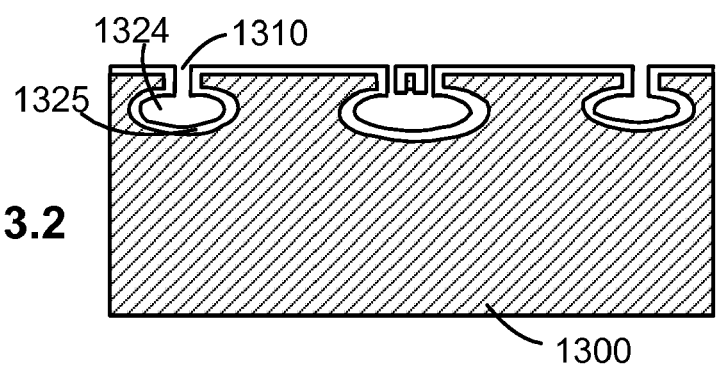
FIG. 13.2

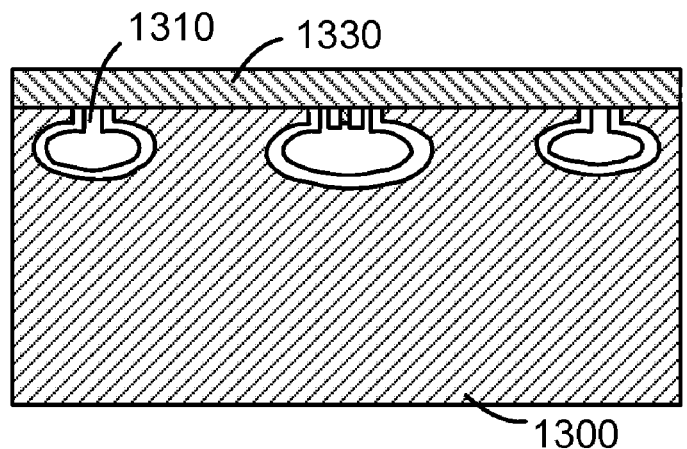
FIG. 13.3
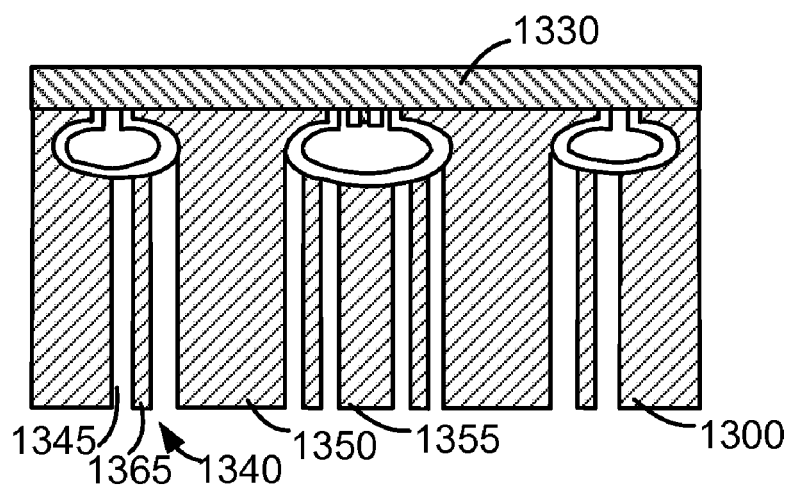
FIG. 13.4
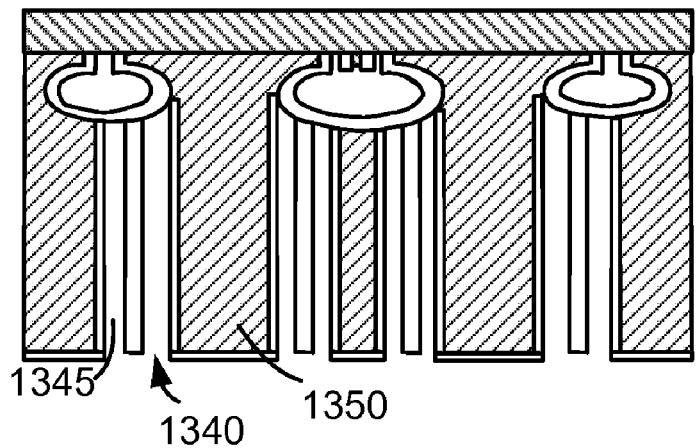
FIG. 13.5

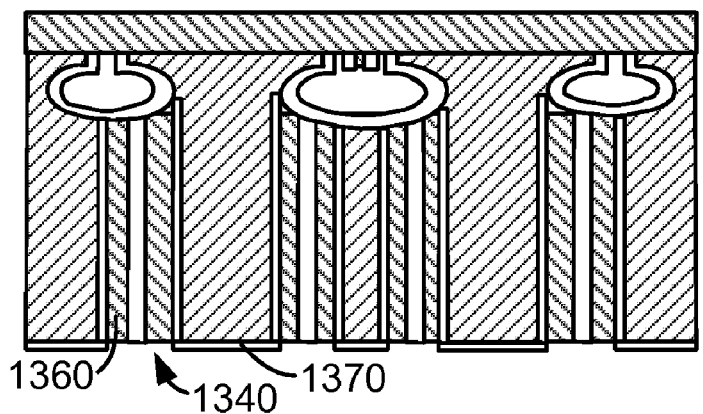
FIG. 13.6
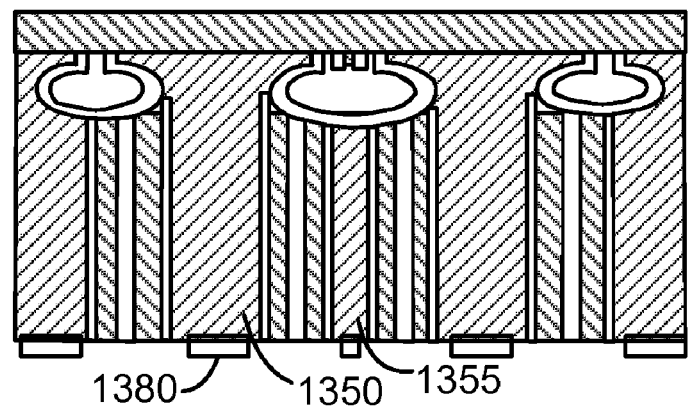
FIG. 13.7
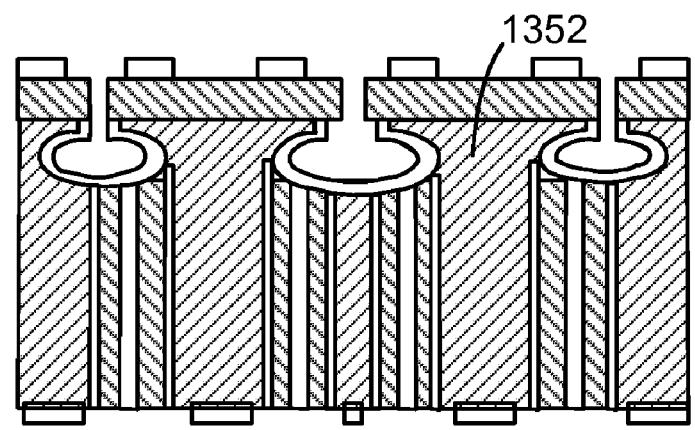
FIG. 13.8

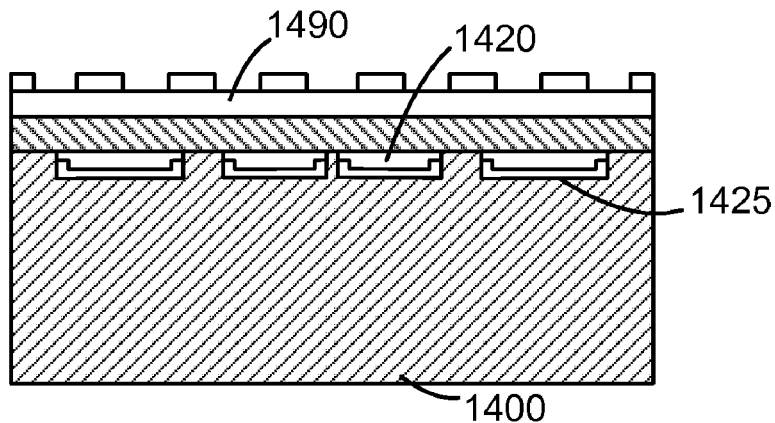
FIG. 14.1
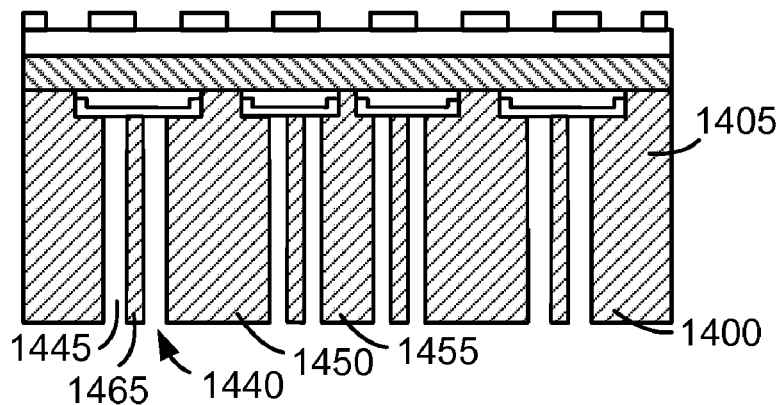
FIG. 14.2
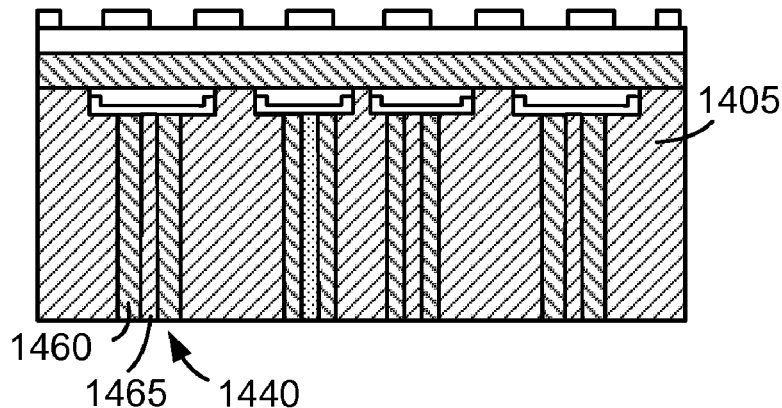
FIG. 14.3

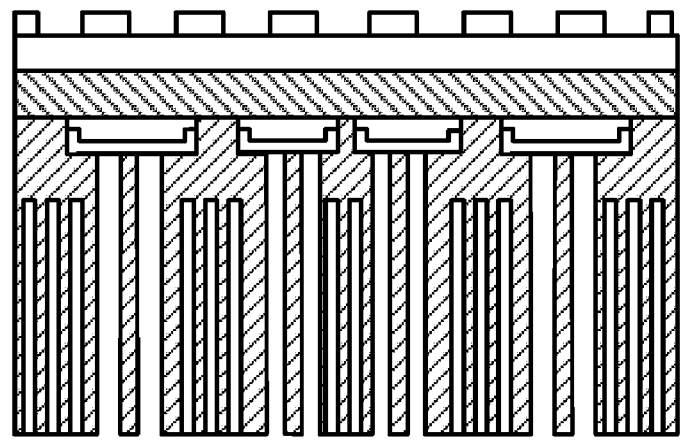
FIG. 14.2A
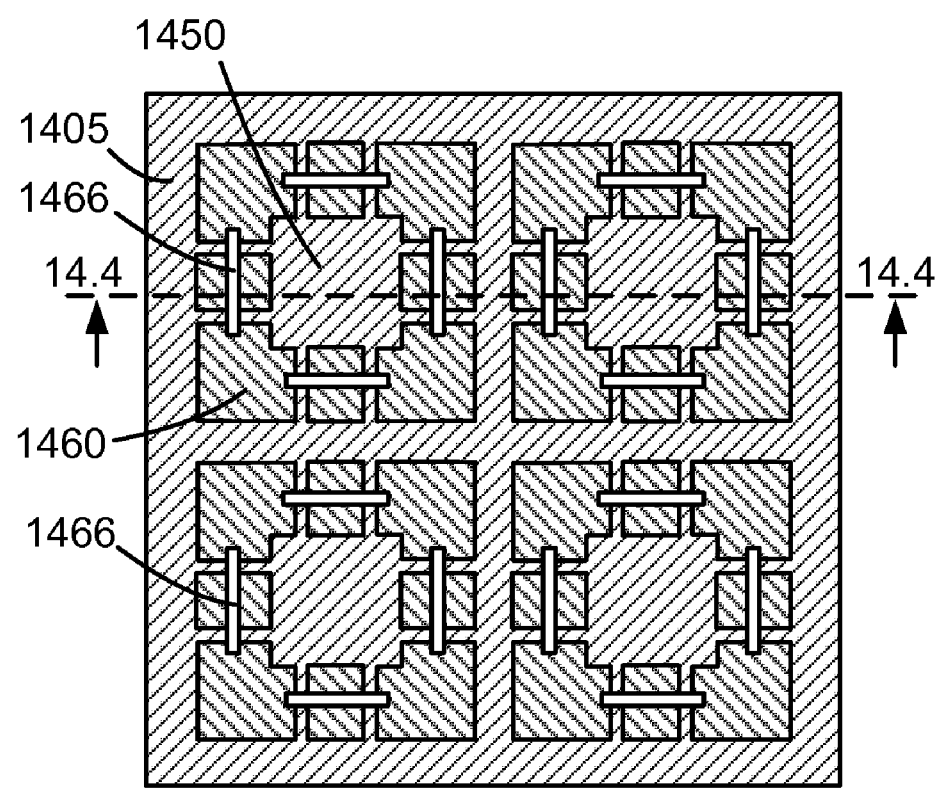
FIG. 14.4B

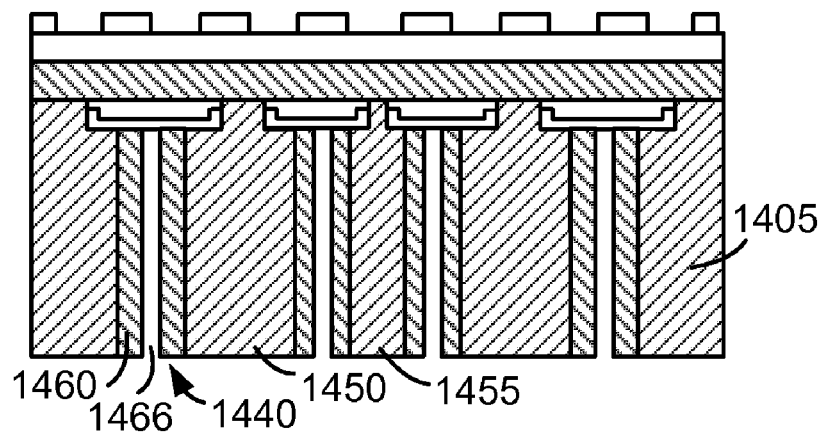
FIG. 14.4
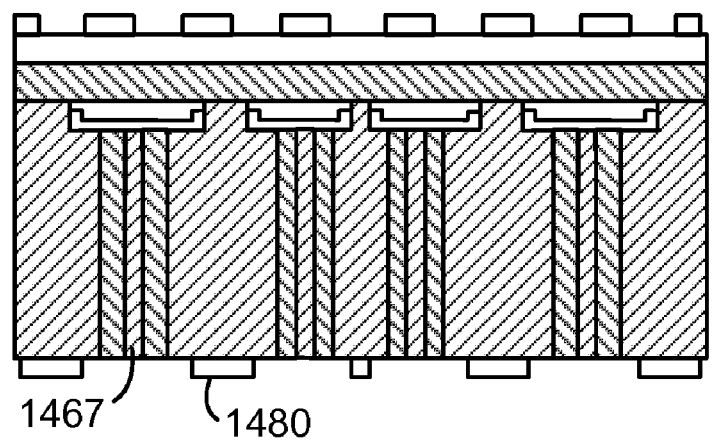
FIG. 14.5
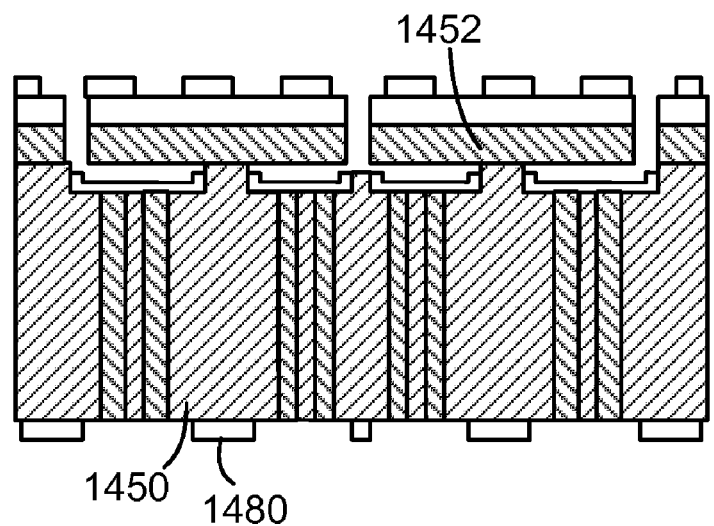
FIG. 14.6

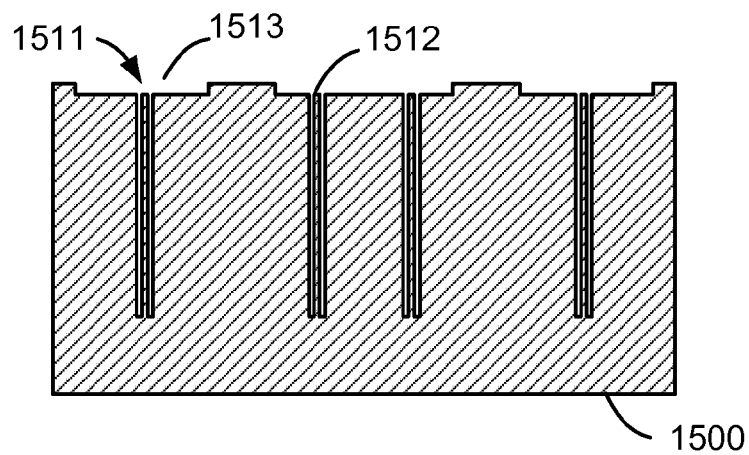
FIG. 15.1A
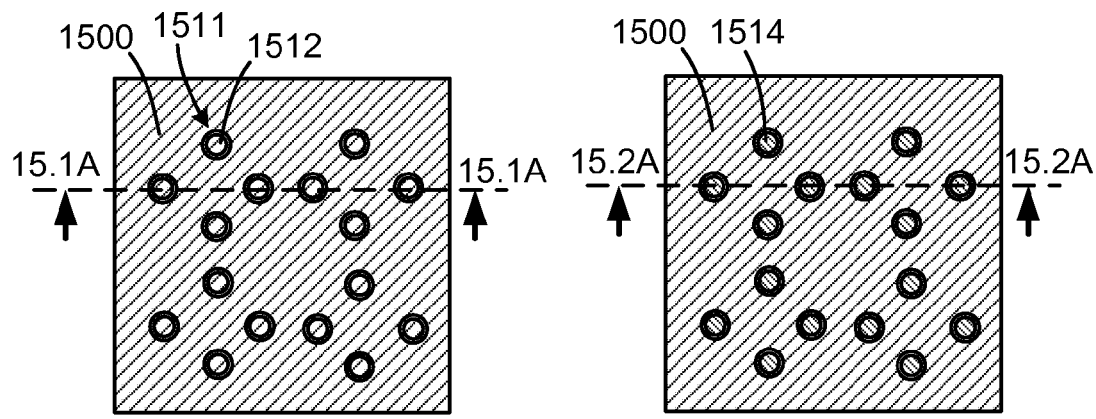
FIG. 15.1B
FIG. 15.2B
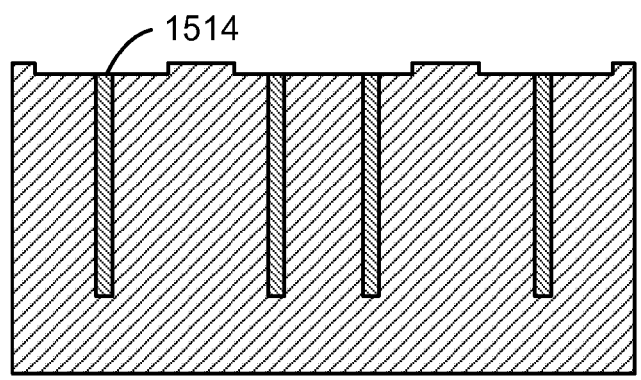
FIG. 15.2A

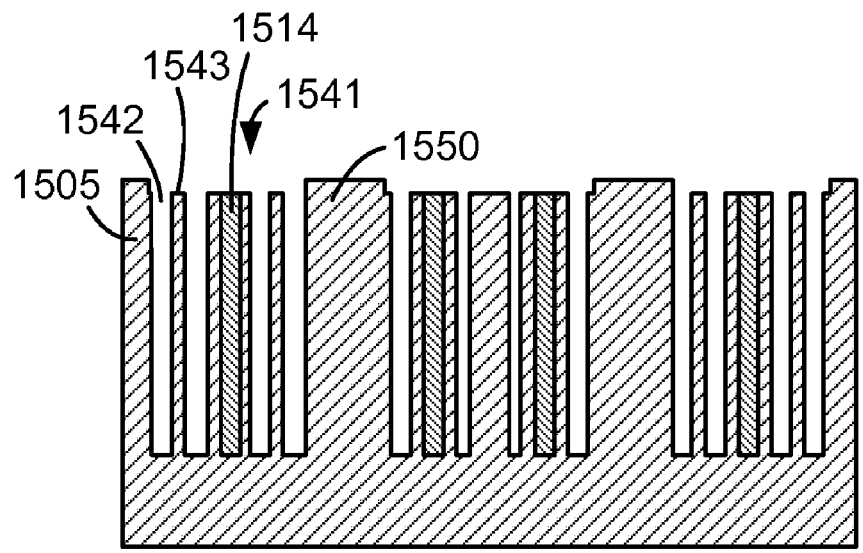
FIG. 15.3A
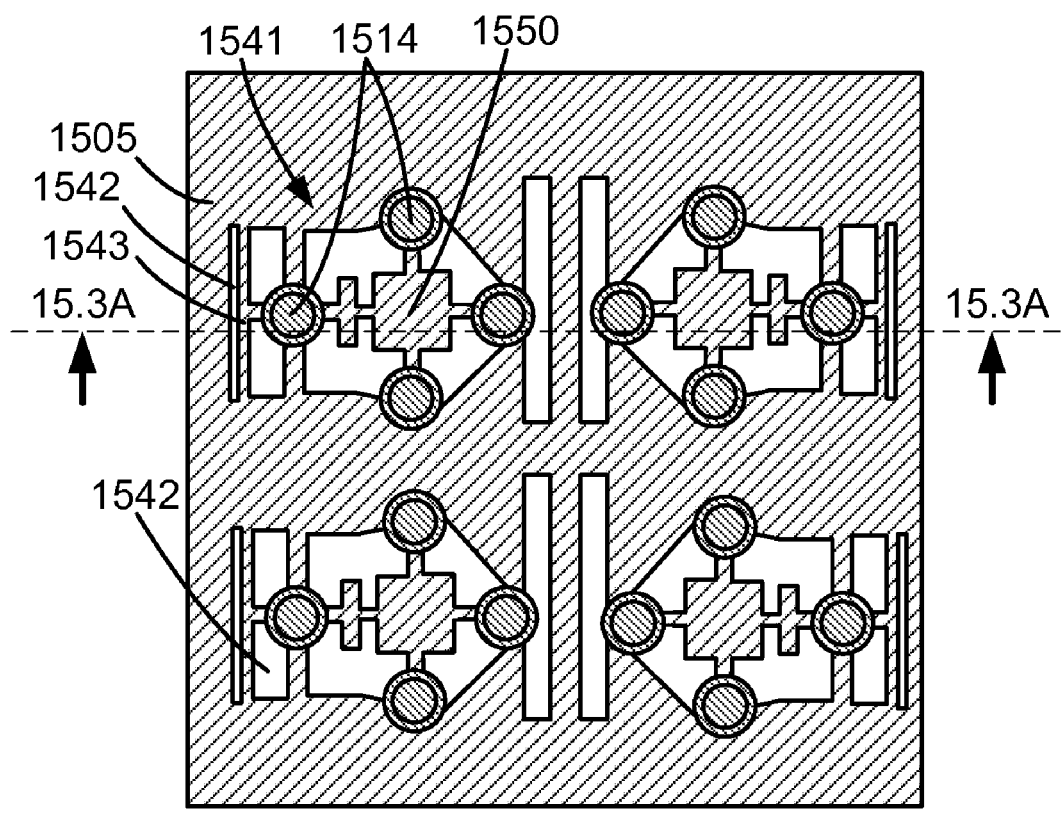
FIG. 15.3B

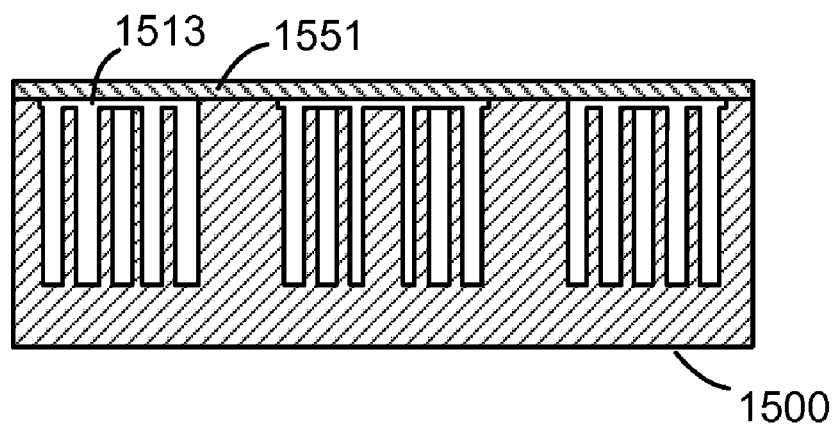
FIG. 15.4
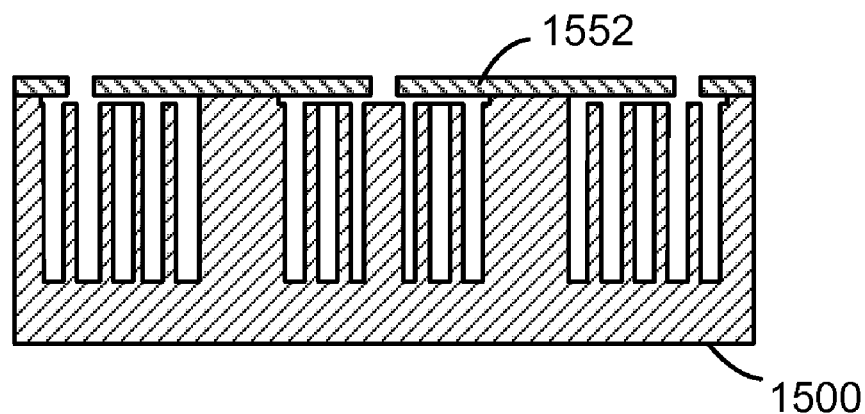
FIG. 15.5
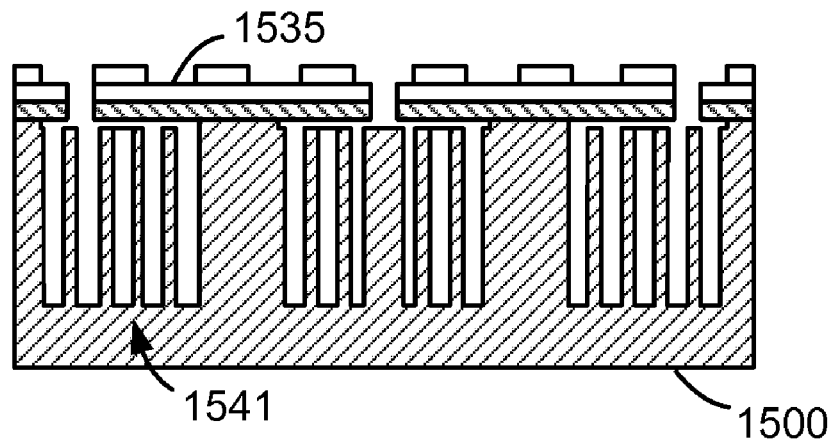
FIG. 15.6

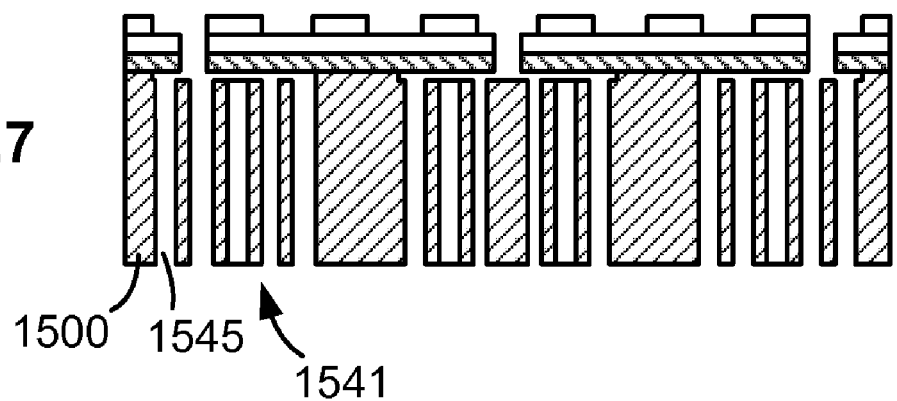
FIG. 15.7
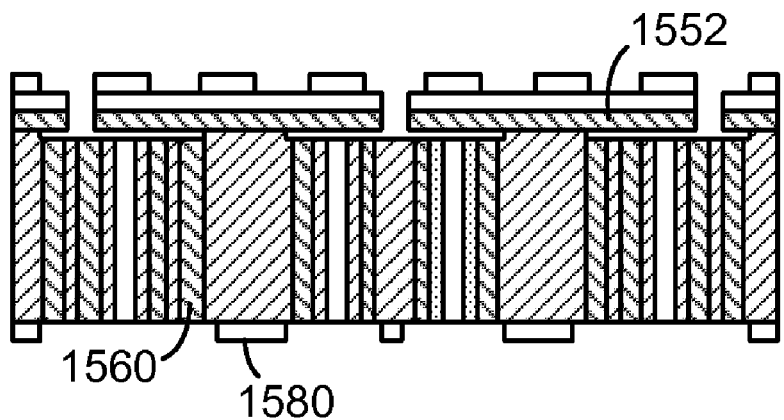
FIG. 15.8 ial. A prior art through-wafer interconnect is shown in FIG. 1. The through-wafer interconnect is built in a via through a substrate 10 by first making a hole 12, then forming a seed layer 14 on surfaces of the hole 12 and subsequently forming a metal layer 16 (e.g., using electroplating methods) on the seed layer 14. The metal layer 16 serves as a through-wafer conductor to electrically connect devices or connectors (not shown) on one side of the substrate 10 to devices or connectors on the other side. In a typical application, devices are on the top side of the substrate 10. The through-wafer conductor (metal layer 16) connects the devices to a connector (such as a connection pad or connection ball) on the backside.

THROUGH-WAFER INTERCONNECTION

RELATED APPLICATIONS

This application is a national stage application of international application PCT/IB2006/051566, claiming priority from U.S. Provisional Application Ser. No. 60/682,619, filed May 18, 2005.

This application further incorporates herein by reference in entirety the following:

International application PCT/IB2006/051567, entitled METHODS FOR FABRICATING MICRO-ELECTRO-MECHANICAL DEVICES, filed on May 18, 2006;

International application PCT/IB2006/051568, entitled MICRO-ELECTRO-MECHANICAL TRANSDUCERS, filed on May 18, 2006; and International application PCT/IB2006/051569, entitled MICRO-ELECTRO-MECHANICAL TRANSDUCERS, filed on May 18, 2006.

FIELD OF THE INVENTION

The present invention relates to microelectronics fabrication, and more particularly to through-wafer interconnection in microelectronics fabrication.

BACKGROUND OF THE INVENTION

Through-wafer interconnection is a structure that electrically connects devices (e.g. integrate circuits and microelectronic devices such as sensors, imagers and transducers) on the front side to the backside of the wafer. Unlike a conventional bond pad interconnection structure that requires out-of-wafer wiring to connect the devices on the front side to the backside, through-wafer interconnection makes the electric connection using a conductor that runs directly through the wafer.

Through-wafer interconnection is highly desired for the high density array of the devices to save the space on the wafer surface. There is a great need for miniaturization of electronic components such as ICs, microelectronic devices used in sensor arrays, transducer arrays, and photo imager arrays, and modules that are used in portable devices like cellular phones and PDAs. Miniaturization not only results in a reduced foot print of the components on the printed board, it can also have a positive effect on the device performance. The ultimate miniaturization is reached when the component is packaged into a chip size package. Conventional methods to enable chip size packaging include routing the bonding pads of ICs into, for example a ball grid array configuration. For some devices, such as those that have vertical discrete components and stacked planar dies, rerouting alone is not sufficient. A different method is needed to enable addressing the backside such that these devices can be packaged into CSP. In this regard, through-wafer interconnection has been proven to be a powerful technique. In addition, through-wafer interconnection allows wafer-level processing that results in simultaneous fabrication of large number of packages. This advantage limits the additional packaging cost that might have incurred due to the high complexity of the technology. It also avoids of the long wires running in or across the wafer surface and thus reduces the undesired parasitic capacitance and high interconnection resistance.

Most through-wafer connections are done with through-wafer vias or holes, which are filled with a connective material. A prior art through-wafer interconnect is shown in FIG. 1. The through-wafer interconnect is built in a via through a substrate 10 by first making a hole 12, then forming a seed layer 14 on surfaces of the hole 12 and subsequently forming a metal layer 16 (e.g., using electroplating methods) on the seed layer 14. The metal layer 16 serves as a through-wafer conductor to electrically connect devices or connectors (not shown) on one side of the substrate 10 to devices or connectors on the other side. In a typical application, devices are on the top side of the substrate 10. The through-wafer conductor (metal layer 16) connects the devices to a connector (such as a connection pad or connection ball) on the backside.

The fabrication process of the above-shown through-wafer interconnections is usually complex and requires rather sophisticated technologies. The fabrication process also lacks freedom for design optimizations. For example, the thickness of the metal layer 16 as shown in FIG. 1 is inherently limited by the existing electroplating techniques. The resultant through-wafer interconnects also lacks physical flexibility. It is therefore desirable to introduce new designs of through-wafer interconnection to improve the fabrication process and the performance of through-wafer interconnects.

SUMMARY

This application discloses a through-wafer interconnect and a method for fabricating the same. Unlike existing methods which make through-wafer interconnects by forming a via in a wafer and introducing a conductive material into the via (e.g., by electroplating, thin film deposition, etc.), the invention method takes a reversed approach by starting with a conductive wafer, for example a highly doped silicon wafer, to form a through-wafer conductor from the native material of the conductive wafer.

One aspect of the present invention is a method for fabricating through-wafer interconnects in a microelectronic structure. The method comprises the steps of (1) providing a conductive wafer having a front side and a backside; (2) forming a patterned trench by removing material of the conductive wafer, wherein the patterned trench has an annular circumferential opening generally dividing the conductive wafer along the opening into an inner portion and an outer portion whereby the inner portion of the conductive wafer is insulated from the outer portion and serves as a through-wafer conductor. A dielectric material may be added into or formed in the patterned trench to mechanically connect the conductors and the surrounding structures together.

Various shapes are suitable for the patterned trench. For example, the patterned trench may have different cross-sectional sizes (such as a diameter) at two portions at different depths of the wafer. In one embodiment, the through-wafer conductor has a bottom portion surrounded and defined by a bottom portion of the patterned trench and a top portion surrounded and defined by a top portion of the patterned trench. The bottom portion of the through-wafer conductor has a smaller cross-sectional size than the top portion of the through-wafer conductor.

The through-wafer conductor may be formed in a conductive layer that has two contiguous sections or a conductive wafer that has a top layer and a bottom layer which are two separate layers bonded together. In another embodiment, the conductive wafer is a doped silicon wafer that has a top section and a bottom section having different doping levels. In a preferred embodiment, the bottom portion of the patterned trench has trench openings broader than that of the top portion, whereby a bottom portion of the through-wafer conductor surrounded and defined by the bottom portion of the patterned trench has a smaller cross-sectional size than a top portion of the through-wafer conductor surrounded and defined by the top portion of the patterned trench.

In one embodiment, the method has additional steps of forming a first portion of the patterned trench from one of the front side or the backside and forming a second portion of the patterned trench from the other side. The first portion of the patterned trench may be oxidized to form a stop layer thereon to define a stop position for the forming of the second portion of the patterned trench stops. A dielectric material may be added into or formed in at least one of the first and the second portions of the patterned trench.

In another embodiment, at least a portion of the patterned trench is further fine-patterned within the trench openings with open passages interlined with lines of unremoved conductive wafer material. The lines of unremoved conductive wafer material may be oxidized to achieve the effect of adding a dielectric material. Alternatively or additionally, a filler material may be added between the oxidized lines of unremoved conductive wafer material. In another embodiment, a first dielectric material is added into a top portion of the patterned trench and a second dielectric material is added into a bottom portion of the patterned trench.

The lines of unremoved conductive wafer material may be patterned to form a framework between the inner portion and the outer portion of the conductive wafer to connect and support the two portions. In one embodiment, at least part of the lines of unremoved conductive wafer material is completely oxidized such that the framework is electrically insulative between the inner portion and the outer portion of the conductive wafer. In another embodiment, a filler material is added into the trench, and at least part of the lines of unremoved conductive wafer material is then etched away such that the framework is electrically insulative between the inner portion and the outer portion of the conductive wafer.

The method may be used to form a plurality of patterned trenches similarly characterized. The plurality of patterned trenches may be arranged side-by-side in an array with neighboring patterned trenches sharing a common trench side, or with neighboring patterned trenches separated by an intervening spacing. The intervening spacing may be occupied by a conductive material for decoupling neighboring conductors. The conductive material in the intervening spacing may be an unremoved native conductive material of the conductive wafer.

In one embodiment of the fabrication method, the conductive wafer is a conductive silicon wafer, and the patterned trench may be formed using semiconductor fabrication methods. An exemplary fabrication method includes the steps of (1) forming a top portion of the patterned trench by etching from the front side of the conductive silicon wafer; (2) forming an oxide layer over surfaces of the top portion of the patterned trench; (3) removing at least part of the oxide layer on a bottom of the top portion of the patterned trench; (4) forming an enlarged cavity at the bottom of the top portion of the patterned trench by isotropic silicon etching; forming a stop layer for backside silicon etching by oxidizing a bottom surface of the enlarged cavity; and (5) forming a bottom portion of the patterned trench by etching from the backside of the conductive silicon wafer to the stop layer.

Another aspect of the invention is a method for fabricating through-wafer interconnects in a microelectronic structure by bonding two conductive wafers together. The method comprising the steps of: (1) bonding a first conductive wafer and a second conductive wafer such that a bottom side of the first conductive wafer contacting a top side of the second conductive wafer; (2) forming a top portion of a patterned trench through a top side of the second conductive wafer by removing material of the first conductive wafer; (3) forming a bottom portion of the patterned trench through the backside of the first conductive wafer to connect with the top portion. The first portion and the second portion of the patterned trench each have an annular circumferential opening generally dividing the respective conductive wafer into an inner portion and an outer portion. The inner portion of the respective conductive wafer is insulated from the outer portion of the respective conductive wafer, and the inner portion of the first conductive wafer and the inner portion of the second conductive wafer are electrically connected to serves as a through-wafer conductor.

In one embodiment, before bonding the second conductive wafer, a cavity is formed on the top side of the first conductive wafer, and at least a bottom surface of the cavity is oxidized to form an etch stop layer thereon. A bottom portion of the patterned trench is then formed by etching through the backside of the first conductive wafer to the etch stop layer.

The second conductive wafer may be either pre-fabricated to contain at least part of a microelectronic device or allows fabricating a microelectronic device after bonding to the first conductive wafer. For the latter, after bonding the second conductive wafer, at least a part of a microelectronic device may be fabricated on the second conductive wafer. A metal layer may be then deposited on top of the second conductive wafer and patterned.

In a preferred embodiment to minimize parasitic capacitance, the bottom portion of the patterned trench has trench openings broader than that of the top portion of the patterned trench, whereby a bottom portion of the through-wafer conductor surrounded and defined by the bottom portion of the patterned trench has a smaller cross-sectional size than a top portion of the through-wafer conductor surrounded and defined by the top portion of the patterned trench.

In another preferred embodiment, the bottom portion of the patterned trench is further fine-patterned within the trench openings with open passages interlined with lines of unremoved conductive wafer material. The lines of unremoved conductive wafer material may be patterned to form a framework between the inner portion and the outer portion of the conductive wafer to connect and support the two portions. At least a part of the lines of unmoved conductive wafer material may be totally oxidized or etched away after adding another dielectrical material into the trench.

Another aspect of the invention is a through-wafer interconnect which provides electrically conductive interconnection between electric contacts on a front side and a backside of a wafer in a microelectronic structure. The through-wafer interconnect comprises: (1) a through-wafer conductor passing through the front side of the wafer to the backside of the wafer; (2) an insulator surrounding at least a main body portion of the conductor; and (3) a frame surrounding the through-wafer conductor and the insulator. At least a portion of the through-wafer conductor and a respective surrounding portion of the frame each have a native material of the wafer. In one embodiment, at least a portion of the conductor and a respective surrounding portion of the frame have a common native material of the wafer. The wafer is preferably a conductive wafer.

The insulator may be a dielectric material added to an annular trench formed in the wafer by removing native material of the wafer. For example, an oxide may be formed on lines of unremoved native material of the wafer patterned in the annular trench. Alternatively or additionally, a filler material may be filled between lines of unremoved native material of the wafer patterned in the annular trench.

In one embodiment of the through-wafer interconnect, the frame has a zigzag shaped wall which is flexible through stretching or compressing.

Another aspect of the present invention is a through-wafer interconnect component that has: (1) a plurality of conductors arranged in an array, each conductor passing through a front side of a conductive wafer to a backside of the conductive wafer; (2) an insulator surrounding each conductor; and (3) a frame supporting the plurality of conductors and the insulator. At least a portion of each conductor and a portion of the frame each have a native material of the conductive wafer. In one embodiment, the insulator is disposed in a plurality of annular trenches each surrounding a respective conductor. The annular trenches are formed by removing native material of the conductive wafer. In one embodiment, the frame has an outer peripheral wall and a plurality of inter-conductor walls; the outer peripheral wall device defines a general area where the plurality of conductors and the insulator are disposed; and a plurality of inter-conductor walls divide the general area into a plurality of sub-areas each containing a conductor and a respective portion of the insulator surrounding the conductor. The inter-conductor walls of the frame may comprise a conductive material to function as a decoupling conductor between the plurality of conductors.

The unique design of the present invention allows for a flexible through-wafer interconnect with a frame having a zigzag shaped wall which is flexible through stretching or compressing.

The present invention avoids the conventional procedure of introducing a conductor to the wafer to make a through-wafer interconnect. Instead, the present invention allows using the native conductive material of a conductive wafer to form a through-wafer conductor. The conductor is insulated from the rest of the wafer using insulators that can be formed using standard semiconductor fabrication processes. The method introduces greater engineering freedom for designing the shape of the conductor to minimize parasitic capacitance, the shape and properties of the insulator, and the shape and mechanical properties of the overall through-wafer interconnect. When used on a silicon wafer, for example, the method can take advantage of semiconductor fabrication and micromachining for creating various shapes and structures. In contrast, the conventional methods are limited by the dimensions and shapes of via holes and the thickness thin films formed by processes such as thin-film deposition, oxidation, or electroplating.

The method and the through-wafer interconnects in accordance with the present invention have applications in a broader range of technologies. It is particularly useful for assembling and packaging microelectronic devices such as microelectronic imagers used in digital cameras and wireless devices with picture capabilities, micromachined ultrasonic transducers, micromirror arrays for optical communication, optical displays, etc.

The foregoing and other features and advantages will become more apparent from the following detailed description of several embodiments, which proceeds with reference to the accompanying figures.

BRIEF DESCRIPTION OF THE DRAWINGS

FIGS. 10.1-10.5 show a process flow of a first exemplary fabrication method.

FIG. 10.4A shows an alternative step in the process of the first exemplary fabrication method.

FIG. 10.3B shows a bottom view of an exemplary trench pattern design in the through-wafer interconnect structure at the step shown in FIG. 10.3.

FIG. 10.3C shows a bottom view of another exemplary trench pattern design in the through-wafer interconnect structure at the step shown in FIG. 10.3.

FIGS. 11.1-11.2 show an exemplary thin silicon line having segments that are completely oxidized.

FIGS. 12.1-12.7 show a process flow of a second exemplary fabrication method.

FIGS. 13.1-13.8 show a process flow of a third exemplary fabrication method.

FIGS. 14.1-14.6 show a process flow of a fourth exemplary fabrication method.

FIG. 14.2A shows an alternative step in the process of the first exemplary fabrication method.

FIG. 14.4B shows a bottom view of the through-wafer interconnect structure at the step shown in FIG. 14.4.

FIGS. 15.1A-15.8 show a process flow of a fifth exemplary fabrication method.

FIGS. 15.1B, 15.2B and 15.3B show top views of the through-wafer interconnection at steps shown in FIG. 15.1A, FIG. 15.2A, and FIG. 15.3A, respectively.

DETAILED DESCRIPTION

Figure 1:
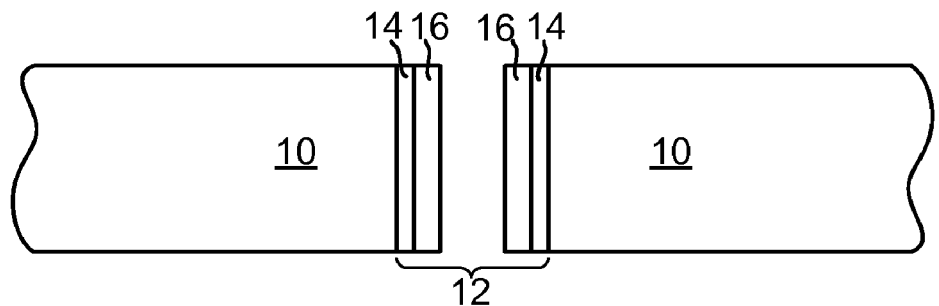
FIG. 1 shows a prior art through-wafer interconnect.

The through-wafer interconnection in accordance with the present invention for will be described in detail along with the figures, in which like parts are denoted with like reference numerals or letters.

In this document, the words "circular" and "annular" only suggest in the broadest sense that a shape has a looped form, a curved shape that is nearly looped, or an arrangement that is generally shaped like a ring, and do not suggest a rounded shape or any other shape in particular, nor does it suggest that the loop or ring is entirely complete or unbroken.

Figure 2:
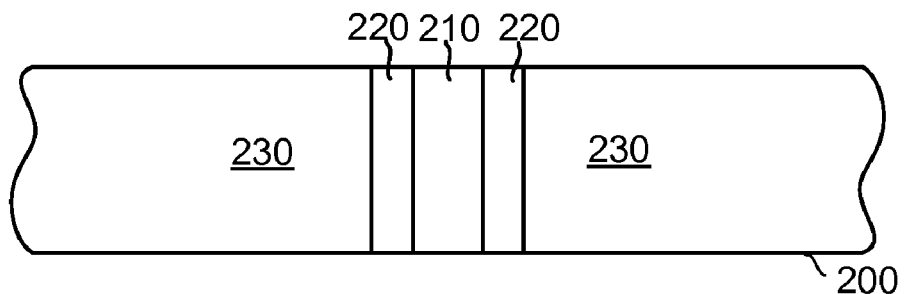
FIG. 2 shows a schematic cross-sectional view of a through-wafer interconnect in accordance with the present invention.

FIG. 2 is a schematic cross-sectional view of a through-wafer interconnect in accordance with the present invention. The through-wafer interconnect is built in a wafer 200. The through-wafer interconnect includes a conductor 210 passing through the front side (top) of the wafer 200 to the backside (bottom) of the wafer. The conductor 210 is surrounded by an insulator 220, and both the conductor 210 and the insulator 220 are surrounded by a frame 230. The through-wafer interconnect in accordance with the present invention is characterized in that at least a portion of the conductor 210 and a respective surrounding portion of the frame 230 each comprise a native material of the wafer 200. As will be shown more clearly in the context of fabrication methods described herein, this means that the conductor 210 may be fabricated directly out of the wafer 200 if the wafer 200 is made of a conductive material.

In this document, a conductive material is defined as one having a resistivity less than $1\times10^4$ Ω-cm. As will be shown in the description of the fabrication methods, one particularly useful conductive material for fabricating a through-wafer interconnect of the present invention is doped silicon wafers. Because the conductor 210 is conductively accessible from both the front side (top) and the backside (bottom) of the wafer 200, with proper connectors (not shown) the through-wafer interconnect in accordance with the present invention provides electrically conductive interconnection between electric contacts on the front side and the backside of the wafer 200. This has many applications in a broader range of technologies. It is particularly useful for assembling and packaging microelectronic devices such as microelectronic imagers used in digital cameras and wireless devices with picture capabilities, micromachined ultrasonic transducers, micromirror arrays for optical communication, optical displays, etc.

For example, a microelectronic device (not shown) may be placed or fabricated directly on the front side (top) of the wafer 200 and connected to an integrated circuit (not shown) which is located on the front side of the wafer 200. The integrated circuit is then connected to the conductor 210 through an electric contact (not shown). The conductor 210 itself may be connected to another electric contact (not shown) on the backside of the wafer 200. In principle, any device that requires, or may be benefited by, a through-wafer interconnect may use the through-wafer interconnect in accordance with the present invention.

Opposite to the prior art concept of through-wafer interconnection, the conductor 210 in the through-wafer interconnect of the present invention may be made of a native material of the conductive wafer 200, instead of being made of an external conductive material introduced to a hole or a via in the wafer. The insulator 220 may be made of one or more insulating materials (such as a dielectric material) added to a void space formed from the wafer 200. Because of its unique design, the invention confers a great level of freedom in designing and fabricating the shape, size, electrical and mechanical properties of the conductor 210, the insulator 220 and the frame 230. For example, the dimensions of the conductor 210 are no longer limited by thin-film deposition or electroplating techniques as in the prior art through-wafer interconnection designs. If the overall conductivity of the conductor 210 needs to be higher, for instance, the requirement may be satisfied by increasing the cross-sectional size (thickness) of the conductor 210.

As will be shown further below, the above described basic concept of the present invention may be applied in the great number of variations.

Figure 3:
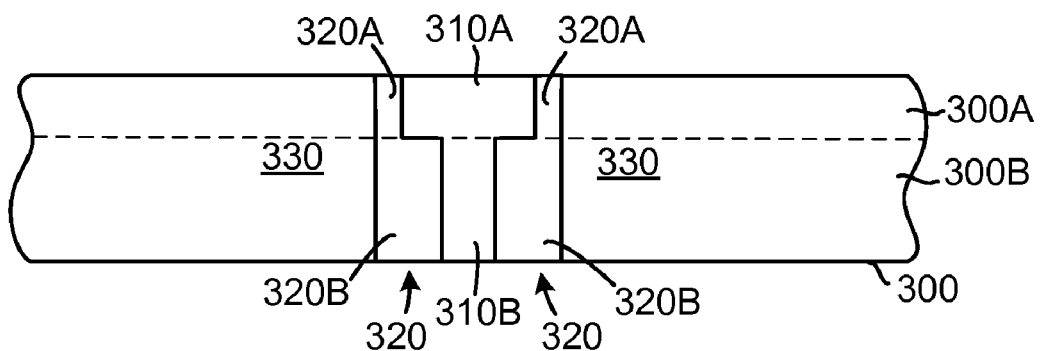
FIG. 3 shows a schematic cross-sectional view of another through-wafer interconnect in accordance with the present invention.

FIG. 3 shows a schematic cross-sectional view of another through-wafer interconnect in accordance with the present invention. This is a more specific embodiment of the general concept illustrated in FIG. 2. The conductor 310 now has a top portion 310A and a bottom portion 310B. The bottom portion 310B has a smaller cross-sectional size than the top portion 310A, resulting in a smaller electric contact area on the backside and thus reducing parasitic capacitance. The insulator 320 has a first portion 320A surrounding the top portion 310A of the conductor 310 and a second portion 320B surrounding the bottom portion 310B of the conductor 310. Similarly, the through-wafer interconnect has a frame 330 surrounding the conductor 310 (310A and 310B) and the insulator (320A and 320B).

It is appreciated that either the top portion 310A of the conductor or the bottom portion 310B of the conductor, or both the top portion 310A and the bottom portion 310B may have a native conductive material of the wafer 300. Correspondingly, a respective surrounding portion of the frame 330 may also have the same native conductive material of the wafer 300. It is further appreciated that the wafer 300 may either be a monolithic wafer or include a top section 300A corresponding in depth to the top portion 310A of the conductor and a bottom section 300B corresponding to the bottom portion 310B of the conductor. The top section 300A and the bottom section 300B may be just two different sections of a single contiguous wafer (wafer 300). For example, the wafer 300 may be a doped conductive silicon wafer, with the top section 300A and the bottom section 300B having different doping levels. Alternatively, the top section 300A and the bottom section 300B may be two separate layers bonded together to form a composite wafer 300. The two separate layers (300A and 300B) of the wafer 300 may be either directly bonded together without an intervening layer or indirectly bonded with an intervening layer. In a configuration in which the two separate layers 300A and 300B are indirectly bonded together with an intervening layer sandwiched therebetween, it is essential that the conductivity from the top portion 310A of the conductor to the bottom portion 300B is not interrupted.

The basic design of through-wafer interconnection in accordance with the present invention may be used for fabricating through-wafer interconnect structures that are more complicated.

Figure 4A:
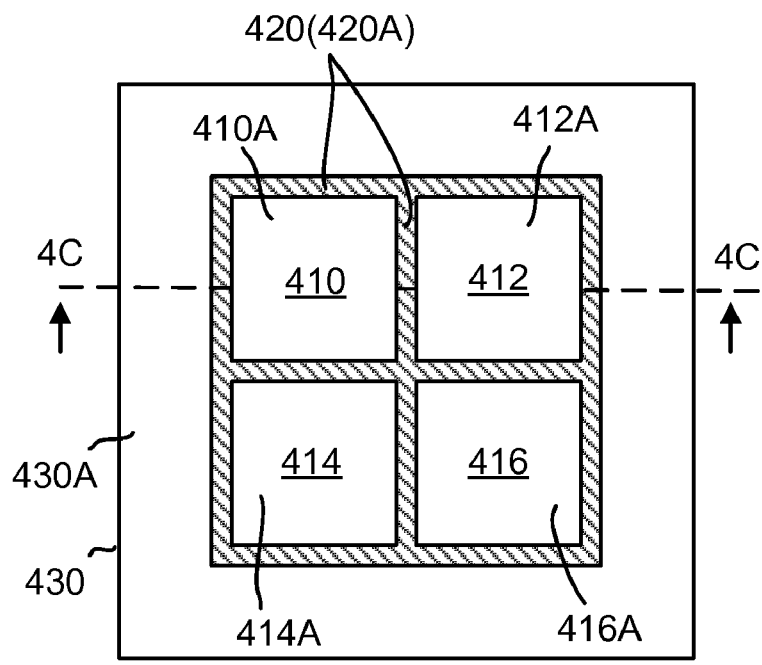
FIGS. 4A-4C show schematics of a through-wafer interconnection design having multiple conductors.
Figure 4B:
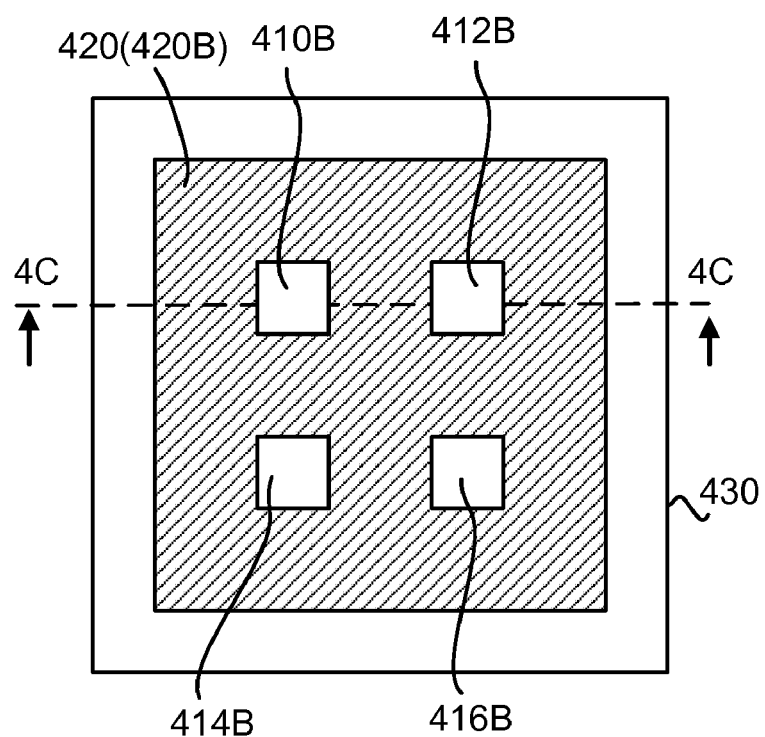
Figure 4C:
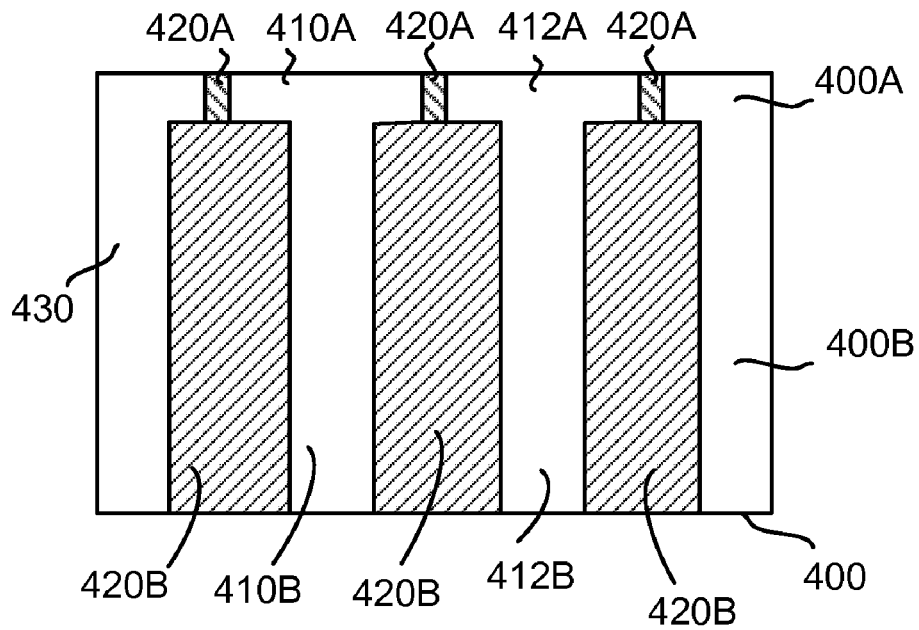

FIGS. 4A-4C show schematics of a through-wafer interconnection design having multiple conductors. FIG. 4A shows a top view of the design, FIG. 4B shows a bottom view of the design, and FIG. 4C shows a cross-section view of the design through the dashed line in FIG. 4A and FIG. 4B.

The through-wafer interconnection structure is built in a conductive wafer 400 and has an array of four conductors 410, 412, 414 and 416 each passing through the front side (top) of a conductive wafer 400 to a backside (bottom) of the conductive wafer 400. The through-wafer interconnection structure further has a patterned insulator having a top portion 420A and the bottom portion 420B. The insulator (420A and 420B) passes through a front side of the conductive wafer 400 to the backside of the conductive wafer 400. The insulator surrounds each conductor 410, 412, 414 and 416. A frame 430 supports the conductors 410, 412, 414 and 416 and the insulator (420A and 420B). Similar to the through-wafer interconnect shown in FIGS. 2-3, the through-wafer interconnection structure in FIGS. 4A-4C is characterized in that at least part of each conductor 410, 412, 414 and 416 and at least a portion of the frame 430 each comprise a native material of the conductive wafer 400, allowing the conductors 410, 412, 414 and 416, and at least a part of the frame 430 to be fabricated directly from the conductive wafer 400.

The conductors 410, 412, 414 and 416 are used to access the devices (not shown) on the front surface (top) of the wafer 400 from the backside (bottom) of the wafer 400.

Still referring to FIGS. 4A-4C, it is shown that conductors 410, 412, 414 and 416 each have a top portion (410A, 412A, 414A and 416A, respectively) and a bottom portion (410B, 412B, 414B and 416B, respectively). The bottom portions 410B, 412B, 414B and 416B each have a smaller cross-sectional size than the respective top portion 410A, 412A, 414A and 416A. The top portions (410A, 412A, 414A and 416A) of the conductors 410, 412, 414 and 416 correspond to the top portion 420A of the insulator in a top section 400A of the conductive wafer 400. The bottom portions (410B, 412B, 414B and 416B) of the conductors 410, 412, 414 and 416 correspond to the bottom portion 420B of the insulator in a bottom section 400B of the conductive wafer 400. Accordingly, the bottom portion 420B has a greater cross-sectional size than the respective top portion 420A.

In FIG. 4C, it is shown that the two sections 400A and 400B belong to the same contiguous monolithic single wafer 400. The two sections 400A and 400B may be of an identical material, but may also be of the same wafer material having different doping levels.

Figure 4D:
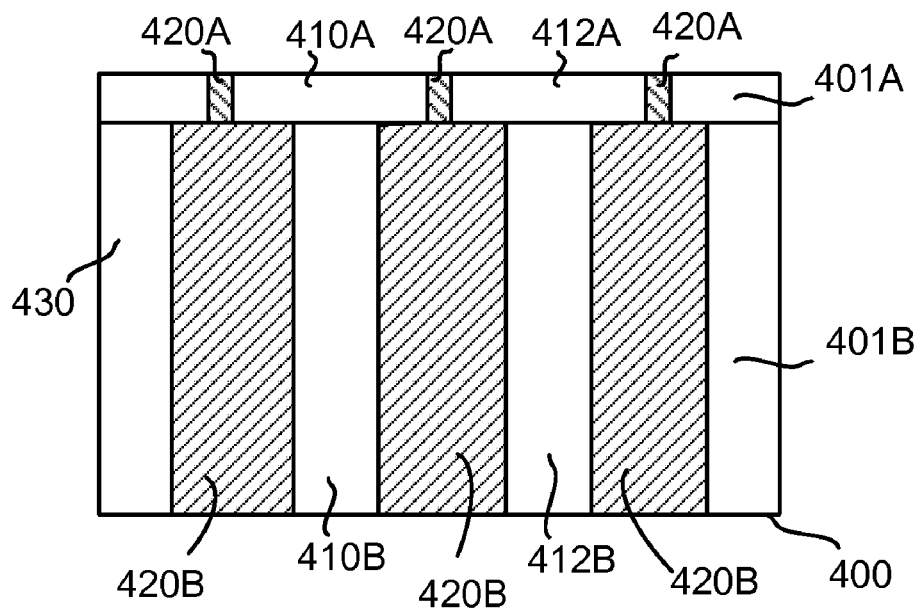
FIG. 4D is a variation of FIG. 4C.

An alternative configuration is shown in FIG. 4D, where top portions 410A, 412A, 414A and 416A and the bottom portions 410B, 412B, 414B and 416B belong to two separate layers, namely a top layer 401A and a bottom layer 401B, that are bonded together to form a composite wafer 400. It is appreciated the two separate layers 401A and 401B may either the bonded together directly as shown in FIG. 4D or bonded indirectly through an intervening material (not shown).

Where the wafer 400 is made of the top layer 401A and the bottom layer 401B, the top portions of the conductor and the top portion of the insulator may be formed in the top layer 401A, while the bottom portions of the conductor and the bottom portion of the insulator may be formed in the bottom layer 401B. In addition to the difference in the cross-sectional sizes, the top portion of the conductor and the bottom portion of the conductor may also be made of different materials. Likewise the top portion of the insulator and the bottom portion of the insulator may also be made of different materials. It is appreciated that many variations or modifications can be made based on the basic design illustrated herein. The only requirement is that the conductivity path along the conductors 410, 412, 414 and 416 between the top side and the bottom side of the wafer 400 is maintained.

In FIGS. 4A-4D and other figures below, an array of four identical conductors is used to demonstrate the interconnection design. However, it is appreciated that the through-wafer interconnection design can be used of for any number of devices, any array of devices, any array of through-wafer conductors, or multiple arrays with different number of devices and conductors, and any other configurations that may require or may benefit from through-wafer interconnection. In addition, although the cross sections of the conductors, the insulator and the frame have a square shape in the examples shown, it is appreciated that these parts can be of any geometric shapes as long as the arrangement thereof provides the desired through-wafer interconnection in accordance with the present invention.

Figure 5A:
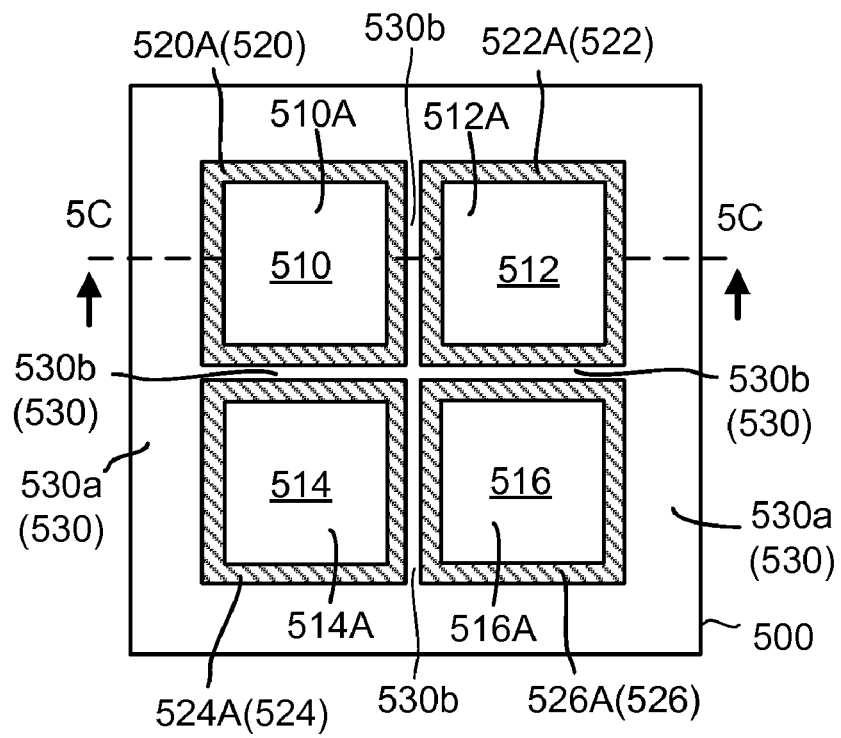
FIGS. 5A-5C show schematics of another through-wafer interconnection design having multiple conductors.
Figure 5B:
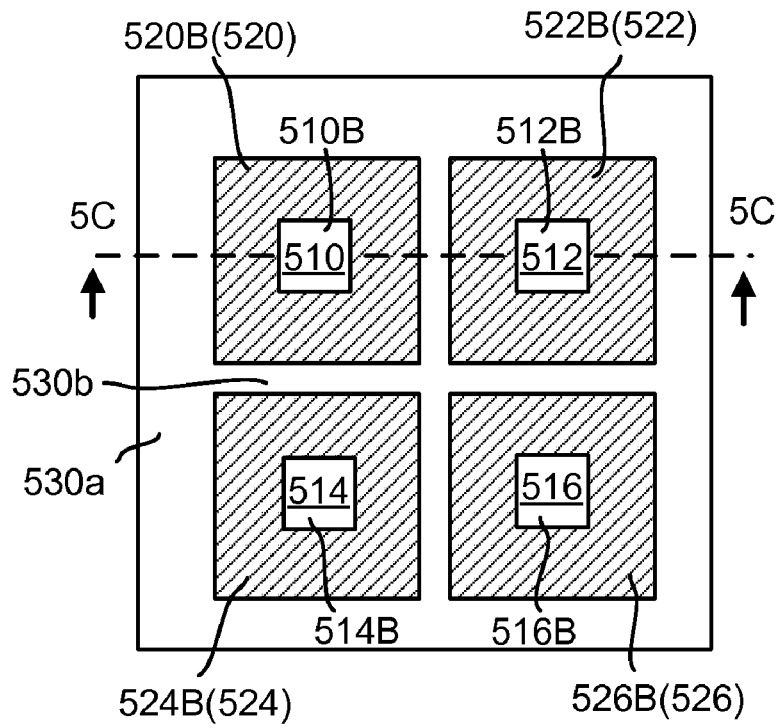
Figure 5C:
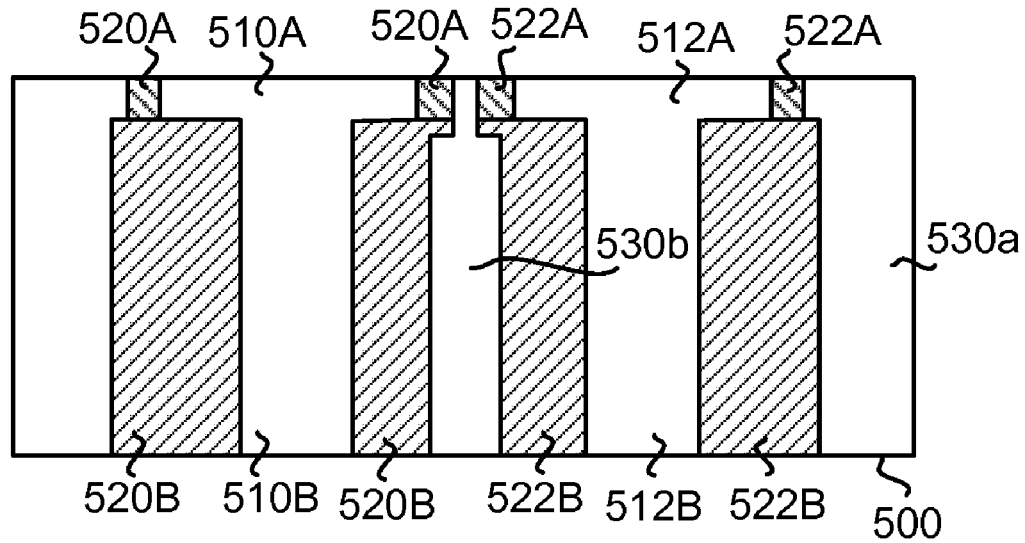

FIGS. 5A-5C show schematics of another through-wafer interconnection design having multiple conductors. FIG. 5A shows a top view of the design, FIG. 5B shows a bottom view of the design, and FIG. 5C shows a cross-section view of the design through the dashed line in FIG. 5A and FIG. 5B.

The through-wafer interconnection structure in FIGS. 5A-5C is similar to that in FIGS. 4A-4C. The through-wafer interconnection structure is built in a conductive wafer 500 and has an array of four conductors 510, 512, 514 and 516 each passing through the front side (top) of a conductive wafer 500 to a backside (bottom) of the conductive wafer 500. The through-wafer interconnection structure further has a patterned insulator assembly that has insulators 520, 522, 524 and 526 each surrounding a corresponding conductor 510, 512, 514 and 516, and a frame 530 mechanically supporting the conductors 510, 512, 514 and 516 and the insulator assembly (insulators 520, 522, 524 and 526). Similar to the through-wafer interconnect shown in FIGS. 2-3 and FIGS. 4A-4C, the through-wafer interconnection structure in FIGS. 5A-5C is characterized in that at least part of each conductor 510, 512, 514 and 516 and at least a portion of the frame 530 each comprise a native material of the conductive wafer 500, allowing the conductors 510, 512, 514 and 516, and at least a part of the frame 530 to be fabricated directly from the conductive wafer 500.

It is also shown in FIGS. 5A-5C that conductors 510, 512, 514 and 516 each have a top portion (510A, 512A, 514A and 516A, respectively) and a bottom portion (510B, 512B, 514B and 516B, respectively). The bottom portions 510B, 512B, 514B and 516B each have a smaller cross-sectional size than the respective top portion 510A, 512A, 514A and 516A. This allows a large interconnection contact area through the top portions 510A, 512A, 514A and 516A of the through-wafer conductors without having to result in an overly large through-wafer conductor to causes undesired effects such as high parasitic capacitance.

It is appreciated that top portions 510A, 512A, 514A and 516A and the bottom portions 510B, 512B, 514B and 516B may either belong to different sections of the same contiguous single wafer 500 or belong to two separate layers that are bonded together to form a composite wafer 500. The two separate layers may either the bonded together directly or bonded indirectly through an intervening material (not shown).

Unlike the through-wafer interconnection structure in FIGS. 4A-4C, the through-wafer interconnect of FIGS. 5A-5C has a slightly more sophisticated frame 530. The frame 530 has an outer peripheral wall 530a and a plurality of inter-conductor walls 530b. The outer peripheral walls 530a define a general area where the conductors 510, 512, 514 and 516 and the insulator assembly of insulators 520, 522, 524 and 526 are disposed, while the plurality of inter-conductor walls 530b further divide the general area into a plurality of sub-areas each containing one of the conductors 510, 512, 514 and 516 and a respective surrounding portion of the insulator assembly (insulators 520, 522, 524 and 526, respectively, in the example) surrounding the conductor.

The inter-conductor walls 530b of the frame 530 may also have a conductive material to function as a decoupling conductor between the plurality of conductors 510, 512, 514 and 516. The conductive material may also be a native material of the conductive wafer 500, thus allowing the decoupling conductor (the inter-conductor walls 530b of the frame 530) to be fabricated, together with the through-wafer conductors 510, 512, 514 and 516, from the conductive wafer 500. The decoupling conductor may be connected to a certain voltage source (DC or AC). The decoupling design is useful in the through-wafer interconnection designs shown herein because electrical AC signals may couple between conductors through insulation material. Placing a conductive layer or wall such as the decoupling conductor 530b between the conductors 510, 512, 514 and 516 helps to shield the electric coupling between these conductors.

Figure 5D:
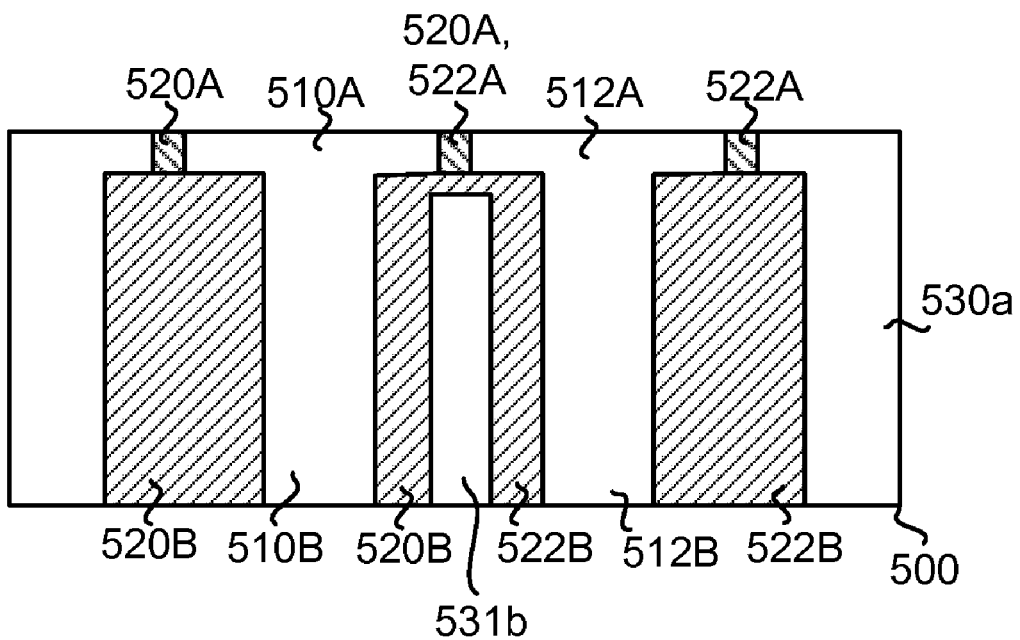
FIG. 5D shows a cross-sectional view of a variation of the through-wafer interconnection structure in FIGS. 5A-5C.

FIG. 5D shows a cross-sectional view of a variation of the through-wafer interconnection structure in FIGS. 5A-5C. In FIG. 5D, the inter-conductor walls 531b are lower than the outer peripheral wall 530a and only extend across the lower portion of the wafer 500.

For some special applications, the transducers may need to connect to a flexible through-wafer connection. The flexible through-wafer connection can be realized by thinning the thickness of the connection. However, with the unique design of the through-wafer interconnection of the present invention, the parts along the through-wafer connection (conductors, insulators and the frame) may be designed as a flexible structure by virtue of its shape instead of its thinness alone.

Figure 6:
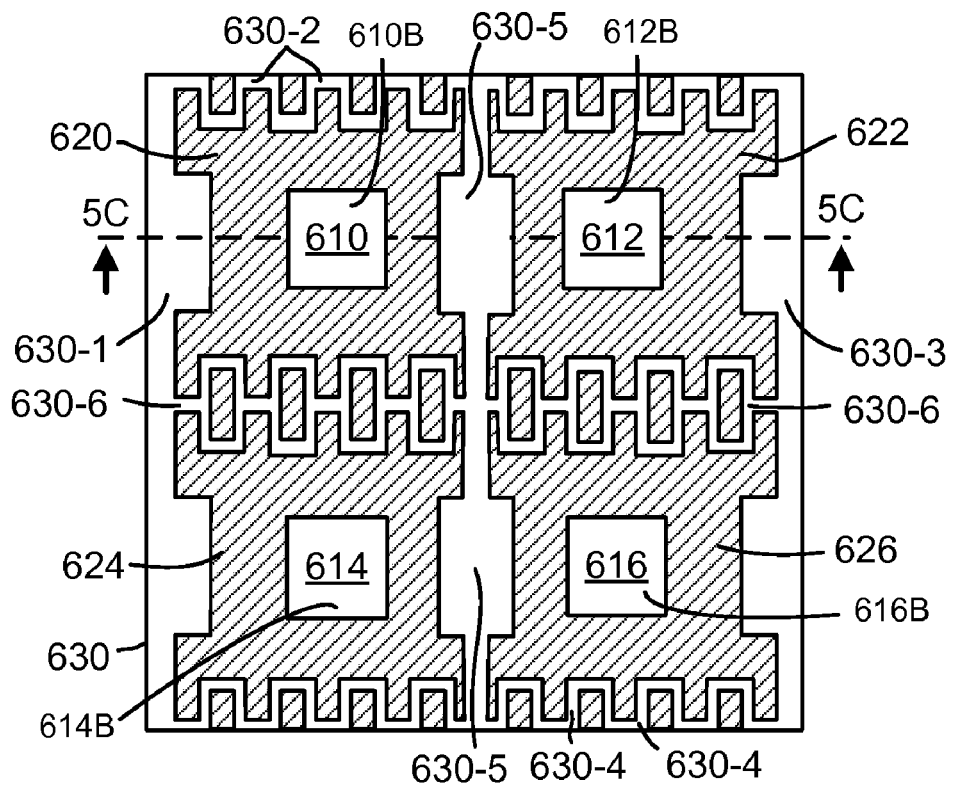
FIG. 6 shows a bottom review of a flexible through-wafer interconnection structure in accordance with the present invention.

FIG. 6 shows a bottom review of a flexible through-wafer interconnection structure in accordance with the present invention. The through-wafer interconnection structure in FIG. 6 is similar to that in FIGS. 5A-5C. If the cross-sectional view is taken from the dashed line indicated, it would look like the cross-sectional view showing in FIG. 5C. The frame 630 has outer peripheral walls 630-1, 630-2, 630-3 and 630-4 that define a general area where the conductors 610, 612, 614 and 616 (shown bottom portions 610B, 612B, 614B and 616B) and the insulator assembly of insulators 620, 622, 624 and 626 are disposed. The frame 630 also has inter-conductor walls 630-5 and 630-6 that further divide the general area into sub-areas each containing one of the conductors 610, 612, 614 and 616 and a respective portion of the insulator assembly (insulators 620, 622, 624 and 626, respectively, in the example) surrounding the conductor.

Unlike the through-wafer interconnection structure in FIGS. 5A-5C, walls 630-2, 630-4 and 630-6 of the frame 630 are made of thin segments and have a zigzag shaped. These thin and zigzag shaped walls provide a degree of flexibility through stretching or compressing. Such flexibility can be particularly helpful when the through-wafer interconnection structure is used for fabricating and packaging microelectronic devices that have a movable part, or have a part that is subject to bending.

As will be more clearly illustrated in the descriptions of fabrication methods, the insulator or insulators in the through-wafer interconnects shown above in FIGS. 4A-4C, FIGS. 5A-5D and FIG. 6 are disposed in annular trenches each surrounding a respective conductor. The annular trenches are formed by removing the native material of the conductive wafer. The insulators may include a dielectric material added to the annular trench.

Figures 7, 8, 9:
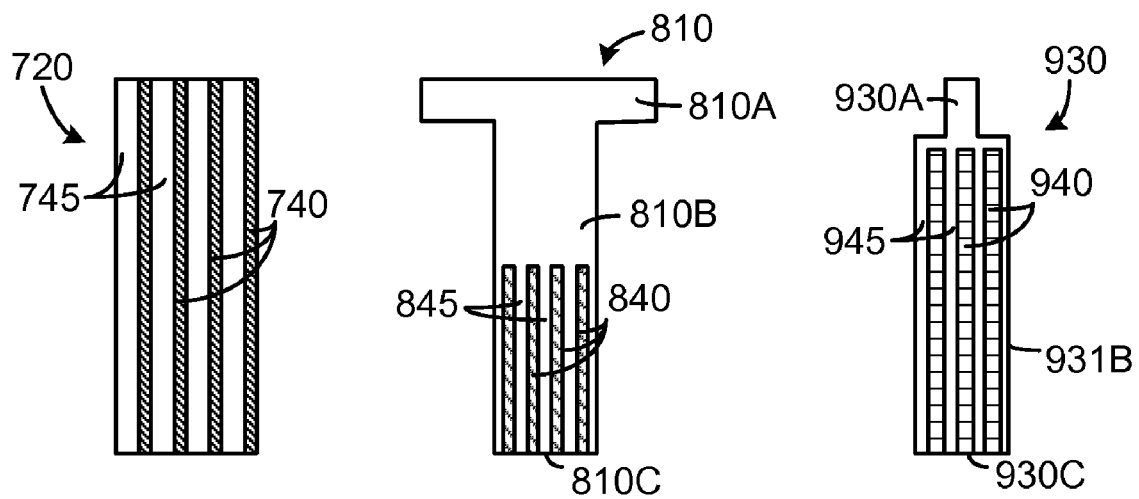
FIG. 7 shows an example of the insulator surrounding the through-wafer interconnection conductor in accordance with the present invention.
FIG. 8 shows an example of a modified conductor in accordance with the present invention.
FIG. 9 shows an example of a modified decoupling conductor in accordance with the present invention.

FIG. 7 shows an example of the insulator surrounding the through-wafer interconnection conductor in accordance with the present invention. The insulator 720 is disposed in an annular trench formed on the wafer (not shown) and constitutes lines 740 of unremoved native material of the wafer interlined with spaces 745. The lines 740 of unremoved native material are formed when the annular trench is formed using a patterned material removal method such as patterned etching method (details shown in the description of fabrication methods herein below). The lines 740 of unremoved native material may form a supporting framework between conductors (e.g. conductors 410 and 412 in FIGS. 4A-4C) and their surrounding frame (e.g., the frame 430 in FIGS. 4A-4C). To ensure electrical insulation by the insulator 720, the lines 740 of unremoved native material of the wafer may be oxidized. To further ensure electrical insulation, at least part of the lines 740 of unremoved native material may be completely oxidized such that the supporting framework formed by the lines 740 is sufficiently insulative between the conductor and the frame (which may also be a part of a conductive wafer and therefore conductive). Alternatively or additionally, a dielectric filler material may be added to fill the spaces 745 between lines 740 of unremoved native material.

FIG. 8 shows an example of a modified conductor in accordance with the present invention. Although initially made from the native material of the wafer, the conductor may be further modified to be partially different from the original native material of the wafer. As shown in FIG. 8, conductor 810 has a top portion 810A and a bottom portion 810B. Part of the native material of the original wafer in the bottom portion 810B is removed from a bottom end 810C to form spaces 845 between lines 840 of unremoved native material. A new material may be then introduced to this partially hallowed structure to modify the physical properties of the conductor 810. For example, the lines 840 may be oxidized to form oxidation, or covered by a new material. Additionally or alternatively, spacings 850 may be filled with another material.

Modification similar to that shown in FIG. 8 with respect to the through-wafer conductor may also be made to a decoupling conductor (e.g., 530b in FIGS. 5A-5C). FIG. 9 shows an example of a modified decoupling conductor in accordance with the present invention. An exemplary decoupling conductor 930 has a top portion 930A and a bottom portion 930B. Part of the native material of the original wafer in the bottom portion 930B is removed from a bottom end 930C to form spaces 945 between lines 940 of unremoved native material. A new material may be then introduced to this partially hallowed structure to modify the physical properties of the decoupling conductor 930. For example, the lines 940 may be oxidized to form oxidation, or covered by a new material. Alternatively, spaces 945 may be filled with another material.

The conductors described herein can be made of the any conductive material. One good choice is to form the conductors using semiconductor wafers (e.g. silicon, GaAs, etc). Heavily doped semiconductor wafer may be used to improve the conductivity. As discussed in FIGS. 4A-4D, FIGS. 5A-5D, and FIGS. 6-9, the through-wafer conductors may be made of the two portions. A top portion is used to connect the devices on the front surface of the wafer. The shape of the top portion of each conductor is usually determined by the dimensions and shapes of the devices which connect to the through-wafer interconnections. For example, the top portion of the conductor can serve as one of the electrodes of capacitance micromachined ultrasonic transducers (cMUTs). The bottom portion of the conductor is designed with a trade-off between the capacitance and resistance of the interconnection. The capacitance increases with the perimeter length of the conductor. A through-wafer conductor of a greater cross-sectional size (i.e., thicker) this means greater parasitic capacitance. On the other hand, the resistance decreases with the cross-sectional size of the conductor. A balance is struck to optimize the performance.

The top portion of the insulator and the bottom portion of the insulator may be made of either the same material or different materials, and both can be made of any kind of medium or material, including but not limited to vacuum, air, silicon, oxide, nitride, SOG, TEOS, polyimide, polymer, rubber, PDMS, PMMA, epoxy, gel, and any filling material for ultrasonic transducers, or a combination thereof. In order to ensure good insulation, however, a useful combination should result in an insulator that is non-conductive as a whole. When a combination of different materials is used in a portion (top portion or bottom portion) of the insulator, preferably at least one material is an insulation material. In addition, a configuration of the insulator should desirably provide the mechanical strength to the wafer so that the wafer or the devices can survive during the device fabrication process and device assembly and packaging.

As will be shown in the fabrication methods described herein, the through-wafer connection can be controlled to a desired thickness using grinding and polishing of the processed wafer in a certain fabrication step. Usually, a thicker through-wafer connection is preferred for easier and more reliable fabrication process and packaging handling, but a thinner through-wafer connection is usually desired to improve the device performance. A balance often needs to be struck. However, the conflict may be at least partially avoided by a carefully designed fabrication process. For example, the wafer thinning can be done before, after or during the fabrications of the through-wafer connection. If the thickness of the wafer is too thin to be handled during the process, the thin wafer with through-wafer connections may be bonded or stuck to another wafer using a proper wafer bonding technique or a proper stiction layer. Using this technique, the resultant bonded wafer as a whole may be robust enough to be processed.

Besides the electric properties, other parameters in the design of the through-wafer connection may also be considered to meet the special needs of the particular device which connects to the through-wafer connection. For example, for the IR sensors, the thermal conductive and a thermal capacitance are important parameters. For an inertial sensor, the through-wafer interconnection may be designed to be insensitive to the vibration coupling from the environment. For an ultrasonic transducer, materials selections and the structure configurations of the through-wafer interconnection should be used to achieve certain acoustic properties. For example, the interconnection should provide acoustic decoupling between the cMUT elements and absorb the acoustic energy leaked into the substrate from the transducers. The through-wafer interconnection in the present invention provides the flexibility to select many different materials and to design the conductors, insulators and decouple conductors with different shapes and configurations to achieve the desired performance.

Fabrication Methods of the Through-Wafer Interconnection

A variety of fabrication methods may be used to make the through-wafer interconnections in accordance with the present invention. The fabrication of the through-wafer interconnections may be done before or after the device fabrication process. Furthermore, the fabrication of the through-wafer interconnections may be integrated with the device fabrications.

The choice of the fabrication methods is dependent on the material compatibility and process compatibility (e.g., the process thermal budget, the etch selectivity, wafer surface topography and the wafer rigidity, etc.) of both the device fabrication and the through-wafer interconnection fabrication. The process method and the materials used should be carefully evaluated at each fabrication step, with consideration to factors such as process temperature, to ensure compatibility. This is especially important when the fabrications of the device and the interconnection are integrated.

Described below are some exemplary fabrication methods for the through-wafer interconnection of the present invention. Silicon wafer is used in these examples for the purpose of illustration. However, the methods of fabrication, including material and process selections, are not limited by the illustrative examples.

Individual steps taken should be interpreted broadly in the context of its intended purpose. For example, the phrase "adding a material" does not mean that the material added must be an external material. It is appreciated that the material may be either alternatively or additionally added by a process of forming a new material, such as oxidation. Furthermore, the thinning process is not shown in the examples of the process flows below. It is appreciated that in the wafer thinning process can be performed before and/or during the fabrication process.

Some fabrication methods described below show a degree of integration of the device fabrication and the through-wafer interconnection fabrication. However, it is appreciated that the interconnection fabrication methods may or may not be integrated with the device fabrications.

Moreover, the through-wafer interconnection may be fabricated by combining some steps or changing the step orders of different fabrication methods described herein.

(1) Fabrication Method I:

FIGS. 10.1-10.5 show a process flow of a first exemplary fabrication method. FIG. 10.4A shows an alternative step in the process. FIG. 10.3B shows a bottom view of the through-wafer interconnect structure after the step shown in FIG. 10.3. The process flow is outlined in the following steps.

In step one (FIG. 10.1), patterned top trenches 1010 are formed on silicon wafer 1000 by silicon etching to define the top portions 1020 of the through-wafer conductors and the top portion of inter-conductor frame 1025. An example of the inter-conductor frame 1025 is illustrated as inter-conductor wall 530b in FIGS. 5A-5D. It is however appreciated that a similar process may be used to fabricate a through-wafer interconnection without inter-conductor frame 1025 (such as that shown in FIGS. 4A-4D).

Viewed from the top of the silicon wafer 1000, patterned top trenches 1010 would show an annular circumferential opening similar to that illustrated in the top views FIG. 4A and FIG. 5A. In this document, the term "annular" means the opening is generally shaped like a ring, but does not suggest any particular shape of the ring, nor does it suggest that the ring is entirely complete or unbroken.

As shown in exemplary top views such as FIG. 4A and FIG. 5A, the annular top trenches 1010 generally divide the silicon wafer 1000 along the trench opening into an inner portion and an outer portion whereby the inner portion of the silicon wafer will serve as a through-wafer conductor of the through-wafer interconnect being made.

In step two (FIG. 10.2), a thermal oxidation 1030 (or LTO, nitride, etc.) is grown over top trenches 1010 to form an etch stop layer 1040 for backside silicon etch in the next step. Additionally or alternatively, a filler material (not shown) may be added into trench 1010 if needed. The filler material may be an external material or formed by oxidation of unremoved native material in the trench 1010. The backside silicon etch will define the shape of the bottom portions of the conductors.

In step three (FIG. 10.3), backside silicon etch is performed to form bottom trenches 1060. The overall pattern of bottom trenches 1060 defines the bottom portions of the through-wafer conductors 1050. In the particular example illustrated, bottom trenches 1060 are not entirely devoid of the wafer material. Instead, each bottom trench 1060 is fine-patterned within the trench openings with open passages (gaps or spaces) 1045 interlined with thin silicon lines 1065 of unremoved conductive wafer material. The shape, size and spacing of the fine pattern within the bottom trenches 1060 is not limited to any particular model, as long as it does a meaningful modification of the properties of an empty trench or a proper preparation for the next step.

In step four (FIG. 10.4), the fine-pattern of the thin silicon lines 1065 are oxidized. Optionally (FIG. 10.4A), open passages 1045 between the thing silicon lines 1065 may be filled with a filler material 1055 without oxidizing the silicon lines 1065. The filler material 1055 may be an oxide, PDMS, SOG or another material for achieving a desired electric or mechanical property.

In step five (FIG. 10.5), if the thing silicon lines 1065 are oxidized in the above step four, optionally the open passages 1045 between the thing silicon lines 1065 can still be filled with a filler material 1055, which may be an oxide, PDMS, SOG or another material for achieving a desired electric or mechanical property.

Preferably the thin silicon lines 1065 are designed so that the thin lines 1065 can be oxidized, the spaces (open passages 1045) can be filled, and the stress induced by the oxidation minimized.

Two exemplary designs of the patterned thin silicon lines 1065 are illustrated in FIG. 10.3B and 10.3C which show the bottom view of the silicon wafer 1000 at the end of step 3 (FIG. 10.3). The pattern shown in FIG. 10.3B will continue with the steps shown in FIGS. 10.4 and 10.5. The pattern shown in FIG. 10.3C will continue with the step shown in FIG. 10.4A. Many other possible patterns and a variety of different thicknesses of the silicon lines may be used. The patterns should desirably provide enough mechanical strength for the wafer during the fabrication and packaging processes. For example, the lines of unremoved conductive wafer material may form a framework between the inner portion (conductor 1050) and the outer portion (frame 1005) of the conductive wafer to connect and support the two portions.

Preferably, at least a part of the thin silicon lines 1065 or a segment of some of the thin silicon lines 1065 in the fine-pattern are thin enough so that it can be completely oxidized to form insulation between conductors. FIGS. 11.1-11.2 show an exemplary thin silicon line having segments that can be completely oxidized. FIG. 11.1 shows thin silicon line 1100 before oxidation. FIG. 11.2 shows the thin silicon line 1100 after oxidation where segments 1110 and 1120 are completely oxidized.

Moreover, the pattern may be designed to minimize the stress built during the oxidation process and, if needed, to be easily filled by selected material (e.g. LTO, SOG, TEOS, nitride, polyimide, polymer, rubber, PDMS, PMMA, epoxy, gel, etc) with desired properties. Finally, the pattern itself may be designed to have desired properties particularly pertinent to the device supported by the through-wafer interconnection. For example, the pattern may be designed to achieve a certain acoustic impedance is the through-wafer interconnection is used for supporting a micromachined ultrasound transducer. In addition, if needed, the patterned structure can be design to be flexible in the desired direction.

The device fabrication (e.g., cMUT fabrication) may be started after the oxidation step (the step three). The through-wafer connections shown in this example can be carried out either before or during the device fabrication.

Furthermore, after step two (FIG. 10.2), a filler material (preferably insulative) may be added into the top trench 1010. With this procedure, it is possible that the insulative material within the top trench 1010 itself can provide enough strength to hold the conductors (or wafers) sturdy enough during the process. In this case, the shape and the inner pattern of the trench 1060 may not need to be designed to form a framework to support and to connect the conductors. An example is shown in FIG. 10.3C. Accordingly, electrical insulation between the conductors may be achieved by simply adding an insulative filler material into trenches, instead of using oxidation of the fine patterns in the patterned trenches.

Furthermore, through-wafer interconnection fabrication method in this example can be done with a reversed sequence by forming the bottom trench 1060 first, then ending with the top trench formation 1010 and a dielectric material filling (no shown).

(2) Fabrication Method II:

FIGS. 12.1-12.7 show a process flow of a second exemplary fabrication method. The process flow is outlined in the following steps.

In step one (FIG. 12.1), top trenches 1210 are etched on silicon wafer 1200. Oxide 1220 is grown over the cavities 1210. Oxide 1220 is patterned so that only the oxide in top trenches 1210 is kept as etch stop 1225 of the backside silicon etch in a subsequent step.

In step two (FIG. 12.2), a second wafer 1230 is bonded to silicon wafer 1200 over the top of top trenches 1210. Wafer 1230 is ground to a desired thickness for forming the top portion of a conductor. The layer 1230 may also be taken from a silicon layer in a SOI wafer.

In step three (FIG. 12.3), a device 1235 (e.g., a cMUT) is fabricated on or above the second wafer 1230 to a stage that the fabricated device still allows high temperature process if the oxidation is needed later. The device 1235 is represented by a simple box without showing details or the exact location. The fabrication of the device 1235 may be finished at this step if there is no more subsequent high temperature process steps. Second wafer 1230 may serve as an electric contact, such as a bottom electrode, of the device 1235.

In step four (FIG. 12.4), patterned bottom trenches 1240 are formed using backside etch to define the bottom portions 1250 of the conductors. Patterned bottom trenches 1240 have patterned lines 1265 of the unremoved native material of silicon wafer 1200 interlined or spaced from each other by gaps or spaces 1245. It is appreciated that any pattern of lines 1265 and spaces 1245, such as that shown in FIG. 10.3B or 10.3C, may be designed and used, depending on the desired process and properties.

In step five (FIG. 12.5), patterned bottom trenches 1240 are oxidized to make insulation between the conductors 1250. Preferably, at least the part of the silicon lines 1265 defined in previous silicon etch step (step four) is completely oxidized. More preferably, all of the silicon lines 1265 are completely oxidized. The oxidation also forms in oxide layer 1270 over the bottom portions 1250 of the through-wafer conductor, as well as bottom portions of the outer frame 1205 and inter-conductor frame 1255.

At step four (FIG. 12.4), if the layer 1230 and the device 1235 can provide enough strength to hold the conductors (or wafers) to survive the process, the shape and the pattern of the trench 1240 may not need to be designed to serve such a purpose. For example, the trench 1240 may be designed to cut through the wafer to achieve the electric insulation between the conductors and the frames directly (such as the pattern shown in FIG. 10.3C). Therefore, the oxidation step (step five, FIG. 12.5) may not be necessary to form insulation between conductors. Nevertheless, a fill material may still be added into the void within the trench if needed to finish the process.

In step six (FIG. 12.6), gaps or spaces 1245 in the patterned bottom trenches 1240 are filled using a material 1260 with desired properties. Vias are opened on the oxide 1270 on the bottom surface of the bottom portions 1250 of the through-wafer conductors to access the conductors. After that, a metal layer 1280 with desired properties is deposited and patterned. A hard mask may be used to form the metal pattern on the backside of the through-wafer interconnection if the voids between the conductors are not going to be refilled after that.

In step seven (FIG. 12.7), fabrication of the device 1235 on the front surface is completed, and top portions 1252 of the conductors are further defined by silicon etch.

It is appreciated that in this method, as well as other methods described herein, some steps (such as oxidation and adding a filling material) are optional. This is not limited to just those specifically indicated as being optional in the description.

(3) Fabrication Method III:

FIGS. 13.1-13.8 show a process flow of a third exemplary fabrication method. This method is similar to the above second method except for using a different technique to define the etch stop for the backside silicon etch which defines the bottom part of the conductors. The process flow is outlined in the following steps.

In step one (FIG. 13.1), top trenches 1310 are etched on silicon wafer 1300. Oxide 1320 is grown over the top trenches 1310. The oxide at the bottom 1322 of the top trenches 1310 is then removed.

In step two (FIG. 13.2), isotropic silicon etch is performed to form cavities 1324. The surface of the cavities 1324 created by the isotropic silicon etch is oxidized to form a stop layer 1325 for backside silicon etch. If desired, the trench 1310 may be field with a filler material (not shown) in this step.

In step three (FIG. 13.3), the device 1330 (e.g., a cMUT) is fabricated on or above the wafer 1300 to a stage that the fabricated device still allows high temperature process if the oxidation is needed later. The fabrication of device 1330 may be finished at this step if there is no more subsequent high temperature process step.

The process from step four to step eight (FIG. 13.4-13.8) is similar to the process described from step four (FIG. 12.4) to step seven (FIG. 12.7) in the fabrication method II. In these figures, the patterned bottom trenches 1340, patterned lines 1365 of the unremoved native material of the silicon wafer 1300, spaces 1345, bottom portions 1350 of the through-wafer conductor, inter-conductor frame 1355, filler material 1360, oxide layer 1370, metal layer 1380, and the top portions 1352 of the conductors, are similar to their equivalents in the fabrication method II.

It is again appreciated that in this method, as well as other methods described herein, some steps are optional.

(4) Fabrication Method IV:

FIGS. 14.1-14.7 show a process flow of a fourth exemplary fabrication method. The process flow is outlined in the following steps.

In step one (FIG. 14.1), the same processes as described in the first three steps of the above fabrication method II shown in FIG. 12.1, FIG. 12.2 and FIG. 12.3 are first performed on silicon wafer 1400. Top trenches 1420 and backside etch stop layer 1425 are formed in these steps. The fabrication process of the device 1490 may also be completed at this stage.

In step two (FIG. 14.2), patterned bottom trenches 1440 are formed using backside etch to define the bottom portions 1450 of the through-wafer conductors. Patterned bottom trenches 1440 has patterned lines 1465 of the unremoved native material of silicon wafer 1400 interlined or spaced from each other by gaps or spaces 1445. It is appreciated that any pattern of lines 1465 and spaces 1445 may be designed and used, depending on the desired process and properties. In this step, inter-conductor frame 1455, which may serve as a decoupling conductor, may also be formed if desired.

In addition, in step two backside etching may also be performed on the frame 1405, the inter-conductor frame 1455, and the bottom portions 1450 of the through-wafer conductors to further modify the structure and properties of the conductors. This technique may be used to achieve some desired effects for the particular type of device that is being fabricated and packaged using the through-wafer interconnection technique. For example, special patterns may be etched, materials may be added, and oxidation performed in the etched patterns in order to achieve special acoustic properties if the device is a micromachined ultrasonic transducer (MUT).

An example of this extra backside etching shown and wafer modification is illustrated in FIG. 14.2A, which is an alternative of the cross-sectional view FIG. 14.2 in step two but with additional etching. It is appreciated that this extra fabrication steps can be incorporated into other fabrication methods in similar ways.

In step three (FIG. 14.3), gaps or spaces 1445 in the patterned bottom trenches 1440 are filled using a material 1460 with desired properties.

In step four (FIG. 14.4), the whole or part of silicon pattern in the bottom trenches 1440 is etched to make isolation between conductors 1450 and the conductive frame (1405 and 1455). For example, at least a part of the previously unremoved silicon lines 1465 may be now removed to form avoids (spaces) 1466. As discussed in step two, the bottom portions 1450 of the through-wafer conductors and the conductive frames (outer frame 1405 and inter-conductor frame 1455) can also be etched into a desired pattern in this step, if such etching has not been performed already in a previous step (e.g., step two).

FIG. 14.4B is a bottom view after the step four.

In step five (FIG. 14.5), avoids 1466 created from the silicon etch at step four is filled using a material or materials 1467 with desired properties. This step is optional. A metal layer 1480 is then deposited and patterned on the bottom surface of the through-wafer conductors and the conductive frames.

In step six (FIG. 14.6), the device fabrication is completed on the wafer surface, and the top portions 1452 of the through-wafer conductors are further defined by etching from the top side of the wafer.

Compared with the fabrication methods 1-3, the fabrication methods 4 does not use high temperature process of thermal oxidation to make insulation between the conductors and the conductive frame. Instead, the whole or part of the silicon pattern between the conductors is etched to achieve the insulation between them (see step four). For this reason, at least one material with desired properties should be used to fill the gaps or spaces within silicon pattern created by the backside silicon etching which also defines the bottom portions of the through-wafer conductors. In contrast, in the fabrication methods 1-3 the step to fill the gaps within the oxide pattern is entirely optional.

The above fabrication method IV may also be combined with the fabrication methods I-III such that the resultant method is substantially similar to the fabrication method IV except that top trenches 1420 and backside etch stop layer 1425 are formed differently.

As in other fabrication methods described herein, wafer thinning can be performed if needed. A hard mask may be used to form the metal pattern on the backside of the through-wafer interconnection if the voids between the conductors are not to be filled.

(5) Fabrication Method V:

FIGS. 15.1-15.8 show a process flow of a fifth exemplary fabrication method. FIGS. 15.1B, 15.2B and 15.3B show top views of the through-wafer interconnection at a respective step. The process flow is outlined in the following steps.

In step one (FIG. 15.1A and FIG. 15.1B), deep silicon etching is performed from the front side of the wafer 1500 to a desired thickness to form deep trenches 1511 with silicon patterns 1512, which can be oxidized to form insulation between the conductors. If desired, etch may go through the entire wafer 1500. Recesses 1513 on silicon surface can be etched first if needed. FIG. 15.1A is a cross-sectional view of this formation, while FIG. 15.1B is the top view of the same. The exemplary silicon pattern shown here is designed to minimize the oxide volume and the thermal stress effects in the structure. Other patterns may be used as long as they can be oxidized and form insulation between the conductors after finishing the fabrication.

In step two (FIG. 15.2A and FIG. 15.2B), the silicon patterns 1512 formed in the previous step is oxidized to form an oxide formation 1514. FIG. 15.2A is a cross-sectional view of this formation, while FIG. 15.2B is the top view of the same.

In step three (FIG. 15.3A and FIG. 15.3B), patterned annular deep trenches 1541 are formed. FIG. 15.3A is a cross-sectional view of this formation, while FIG. 15.3B is the top view of the same. The annular deep trenches 1541 have unremoved silicon lines 1543 and empty spaces (voids) 1542, together forming a framework between the frame 1505 and conductors 1550. The annular deep trenches 1541 will insulate the conductors and define the bottom portions of the conductors. A thin oxide may be grown to form a stop layer for late process.

In step four (FIG. 15.4), a prime wafer 1551 is bonded to the patterned wafer 1500 over recesses 1513 and is ground and polished to a desired thickness. The layer 1551 may also obtained by bonding with an SOI wafer.

In step five (FIG. 15.5), the prime wafer 1551 is patterned and etched to form the top portions 1552 of the conductors. Step five is optional.

In step six (FIG. 15.6), devices 1535 are fabricated. A etch process may be performed to define the top part of the conductors.

In step seven (FIG. 15.7), the wafer 1500 is ground (and polished if needed), or etched, to reach the bottom of the annular deep trenches 1541 from the backside of the wafer. If an etch stop layer was formed at the bottom of the annular deep trenches 1541 in a previous step, the backside etching stops at the etch stop layer.

In step eight (FIG. 15.8), voids 1545 in the silicon pattern are filled with a desired material 1560 if needed. A metal layer 1580 is then deposited and patterned on the backside of the wafer.

If the through-wafer interconnection is used for a cMUT, the top portions 1552 of the through-wafer conductors may serve as the substrate, as well as the bottom electrode, of the cMUT. A hard mask may be used to form the metal pattern on the backside of the through-wafer interconnection if the voids between the conductors are not to be refilled.

There is a broader range of applications of the through-wafer interconnection of the present invention. In general, it can be used for miniaturization of electronic components such as ICs, microelectronic devices used in sensor arrays, transducer arrays, and photo imager arrays, and modules that are used in portable devices like cellular phones and PDAs. The application of the present invention helps to avoid long wires running in or across the wafer surface and thus reduces the undesired parasitic capacitance and high interconnection resistance. The invention thus facilitates the realization of ultimate miniaturization in reaching chip size packaging (CSP) of the components. This could potentially result in a more efficient fabrication process, reduced foot print of the components on the printed board, greater fill factor, and can also improve the device performance. In particular, the design of the present invention can be used for devices that have vertical discrete components and stacked planar dies where the conventional rerouting methods are insufficient. The fabrication methods of through-wafer interconnection of the present invention allow wafer-level processing that results in simultaneous fabrication of large number of packages.

One exemplary envisioned application of the through-wafer interconnection is in micromechanical smart sensor and actuator systems, including but not limited to photo imagers used in digital cameras and cell phones, micromachined ultrasonic transducers (MUTs such as cMUTs, pMUTs and mMUTs), and micromirror array. Such systems are often realized as a multi-wafer device in which the mechanical functions are distributed over different wafers and one of the wafers is dedicated to contain the readout circuits. The individually processed wafers can be assembled using wafer-to-wafer bonding and can be combined to one single functional electromechanical unit using the through-wafer interconnect of the present invention, provided that the processes involved comply with the constraints imposed by the proper operation of the active electrical and the micromechanical systems.

In particular, the through-wafer interconnection technology according to the present invention may be used in fabricating and packaging the novel MUTs (especially cMUTs) disclosed in international patent applications PCT/IB2006/051567 entitled METHODS FOR FABRICATING MICRO-ELECTRO-MECHANICAL DEVICES; PCT/IB2006/051568 entitled MICRO-ELECTRO-MECHANICAL TRANSDUCERS; and PCT/IB2006/051569 entitled MICRO-ELECTRO-MECHANICAL TRANSDUCERS.

These patent applications are hereby incorporated herein by reference in their entirety.

In the foregoing specification, the present disclosure is described with reference to specific embodiments thereof, but those skilled in the art will recognize that the present disclosure is not limited thereto. Various features and aspects of the above-described disclosure may be used individually or jointly. Further, the present disclosure can be utilized in any number of environments and applications beyond those described herein without departing from the broader spirit and scope of the specification. We claim all such modifications and variations that fall within the scope and spirit of the claims below. The specification and drawings are, accordingly, to be regarded as illustrative rather than restrictive. It will be recognized that the terms "comprising," "including," and "having," as used herein, are specifically intended to be read as open-ended terms of art.

The invention claimed is:

1. A method for fabricating through-wafer interconnects in a microelectronic structure, the method comprising:
providing a conductive wafer having a front side and a backside; and
forming a patterned trench in the conductive wafer by removing material of the conductive wafer, wherein the patterned trench has an annular circumferential opening dividing the conductive wafer along the opening into an inner portion and an outer portion whereby the inner portion of the conductive wafer is insulated from the outer portion and serves as a through-wafer conductor, and wherein the patterned trench comprises a first trench portion having a first cross-sectional size and a second trench portion having a second cross-sectional size different from the first cross-sectional size.

2. The method of claim 1 further comprising adding a filler material into the patterned trench to form a mechanical support between the inner portion and the outer portion to maintain the inner portion within the annular circumferential opening.

3. The method of claim 1 further comprising adding a dielectric material into the patterned trench to electrically insulate the inner portion from the outer portion.

4. The method of claim 1 further comprising:
forming the through-wafer conductor to have a first portion surrounded and defined by the first portion of the patterned trench and a second portion surrounded and defined by the second portion of the patterned trench; and
forming the second portion of the through-wafer conductor to have a smaller cross-sectional size than the first portion of the through-wafer conductor.

5. The method of claim 1 further comprising forming the conductive wafer has as a composite wafer having a top layer and a bottom layer that are bonded together.

6. The method of claim 5 wherein the top layer and the bottom layer of the conductive wafer are directly bonded together without an intervening layer of material.

7. The method of claim 1 wherein the top layer and the bottom layer of the conductive wafer are directly bonded together with an intervening material that serves as a stop material between the first trench portion and the second trench portion.

8. The method of claim 1 wherein the conductive wafer is a doped silicon wafer having a top section and a bottom section which have different doping levels.

9. The method of claim 1 wherein the forming the patterned trench comprises:
forming a first portion of the patterned trench from one of the front side and the backside; and
forming a second portion of the patterned trench from the other side.

10. The method of claim 9 wherein the forming the patterned trench further comprises oxidizing the first portion of the patterned trench to form a stop layer on a bottom of the first portion to define a stop position, and wherein the forming the second portion of the patterned trench stops when the second portion of the patterned trench reaches the stop position.

11. The method of claim 9 wherein the forming the patterned trench further comprises adding a dielectric material in at least one of the first and the second portions of the patterned trench.

12. The method of claim 1, wherein at least a portion of the patterned trench is further fine-patterned within trench opening with open passages interlined with lines of unremoved conductive wafer material.

13. The method of claim 12 further comprising adding a filler material between the lines of unremoved conductive wafer material.

14. The method of claim 12 further comprising oxidizing the lines of unremoved conductive wafer material.

15. The method of claim 14 further comprising adding a filler material between the oxidized lines of unremoved conductive wafer material.

16. The method of claim 1 wherein the forming the patterned trench comprises forming a plurality of patterned trenches similarly characterized.

17. The method of claim 16 wherein the plurality of patterned trenches are arranged side-by-side in an array with neighboring patterned trenches sharing a common trench side.

18. The method of claim 16 wherein the plurality of patterned trenches are arranged side-by-side in an array with neighboring patterned trenches separated by an intervening spacing.

19. The method of claim 18 wherein the intervening spacing is occupied by a conductive material for decoupling neighboring conductors.

20. The method of claim 19 wherein the conductive material in the intervening spacing comprises unremoved conductive material of the conductive wafer.

21. The method of claim 1 wherein the conductive wafer is a conductive silicon wafer, and the forming the patterned trench comprises:
forming the first portion of the patterned trench by etching from one of the front side and the backside of the conductive silicon wafer;
forming an oxide layer over surfaces of the first portion of the patterned trench;
removing at least part of the oxide layer on a bottom of the first portion of the patterned trench;
forming an enlarged cavity at the bottom of the first portion of the patterned trench by isotropic silicon etching;
forming a stop layer by oxidizing a bottom surface of the enlarged cavity; and
forming the second portion of the patterned trench by etching from the other one of the front side or the backside of the conductive silicon wafer to reach the stop layer.

22. A method for fabricating through-wafer interconnects in a microelectronic structure, the method comprising:
providing a conductive wafer having a front side and a backside;
forming a first portion of a patterned trench from one of the front side or the backside in the conductive wafer by removing material of the conductive wafer, the patterned trench having an annular circumferential opening dividing the conductive wafer along the opening into an inner portion and an outer portion so that the inner portion of the conductive wafer is located within the annular circumferential opening and insulated from the outer portion to form a through-wafer conductor, the first portion of the patterned trench being formed having a first pattern;
providing a stop material on a bottom of the first portion to define a stop position; and
forming a second portion of the patterned trench from the other of the front side and the backside, the forming the second portion of the patterned trench ceasing when the second portion of the patterned trench reaches the stop position, the second portion of the patterned trench being formed having a second pattern different from the first pattern of the first portion of the patterned trench.

23. The method of claim 22 further comprising adding a filler material into at least one of the first portion of the patterned trench or the second portion of the patterned trench to form a mechanical support between the inner portion and the outer portion to maintain the inner portion within the annular circumferential opening.

24. The method of claim 23 wherein the filler material is a dielectric material added into the patterned trench to electrically insulate the inner portion from the outer portion.

25. The method of claim 22 wherein first portion of the patterned trench has a first cross-sectional size and the second portion of the patterned trench has a second cross-sectional size different from the first cross-sectional size.

26. The method of claim 22 further comprising:
forming the through-wafer conductor to have a first portion surrounded and defined by the first portion of the patterned trench and a second portion surrounded and defined by the second portion of the patterned trench; and
forming the second portion of the through-wafer conductor to have a different cross-sectional size than the first portion of the through-wafer conductor.

27. The method of claim 22 further comprising forming the conductive wafer as a composite wafer having a top layer and a bottom layer that are bonded together.

28. The method of claim 27 wherein the top layer and the bottom layer of the conductive wafer are directly bonded together without an intervening layer of material.

29. The method of claim 27 wherein the top layer and the bottom layer of the conductive wafer are directly bonded together with an intervening material that also serves as the stop material.

30. The method of 29 wherein the intervening material is an oxide layer formed on the one of the top layer or the bottom layer of the conductive wafer.

31. The method of claim 22 wherein the conductive wafer is a doped silicon wafer having a top section and a bottom section, which have different doping levels.

32. The method of claim 22 wherein the providing the stop material comprises oxidizing the first portion of the patterned trench to form a stop layer on a bottom of the first portion of the patterned trench to define the stop position.

33. The method of claim 22 further comprising adding a dielectric material in at least one of the first portion of the patterned trench or the second portion of the patterned trench.

34. The method of claim 22, wherein at least a portion of the patterned trench is further fine-patterned within a trench opening with open passages interlined with lines of unremoved conductive wafer material.

35. The method of claim 34 further comprising adding a filler material between the lines of unremoved conductive wafer material.

36. The method of claim 34 further comprising oxidizing the lines of unremoved conductive wafer material.

37. The method of claim 22 wherein the forming the first portion of the patterned trench and the second portion of the patterned trench comprises forming a plurality of patterned trenches, each patterned trench having the first and second portions.

38. The method of claim 37 wherein the plurality of patterned trenches are arranged side-by-side in an array with neighboring patterned trenches sharing a common trench side.

39. The method of claim 37 wherein the plurality of patterned trenches are arranged side-by-side in an array with neighboring patterned trenches separated by an intervening spacing.

40. The method of claim 39 wherein the intervening spacing is occupied by a conductive material for decoupling neighboring conductors.

41. The method of claim 40 wherein the conductive material in the intervening spacing comprises unremoved conductive material of the conductive wafer.

42. The method of claim 22 wherein the conductive wafer is a conductive silicon wafer, and the providing the stop material comprises:
forming an enlarged cavity at a bottom of the first portion of the patterned trench by isotropic silicon etching; and
forming the stop material by oxidizing a bottom surface of the enlarged cavity to define a stop layer.

43. A method for fabricating through-wafer interconnects in a microelectronic structure, the method comprising:
providing a conductive wafer having a front side and a backside;
forming a first portion of a patterned trench from one of the front side or the backside in the conductive wafer by removing material of the conductive wafer, the patterned trench having an annular circumferential opening dividing the conductive wafer along the opening into an inner portion and an outer portion so that the inner portion of the conductive wafer is insulated from the outer portion to form a through-wafer conductor, the first trench portion having a first cross-sectional size;
providing a stop material on a bottom of the first portion to define a stop position; and
forming a second portion of the patterned trench from the other of the front side and the backside, the forming the second portion of the patterned trench stopping when the second portion of the patterned trench reaches the stop position, the second trench portion having a second cross-sectional size different from the first cross-sectional size of the first portion of the patterned trench.

44. The method of claim 43 further comprising adding a filler material into at least one of the first portion of the patterned trench or the second portion of the patterned trench to form a mechanical support between the inner portion and the outer portion to maintain the inner portion within the annular circumferential opening.

45. The method of claim 44 wherein the filler material is a dielectric material added into the patterned trench to electrically insulate the inner portion from the outer portion.

46. The method of claim 43 wherein the first cross-sectional size and the second cross-sectional size determine electrical and mechanical properties of a finished microelectronic structure.

47. The method of claim 43, further comprising:
forming the through-wafer conductor to have a first portion surrounded and defined by the first portion of the patterned trench and a second portion surrounded and defined by the second portion of the patterned trench; and
forming the second portion of the through-wafer conductor to have a different cross-sectional size than the first portion of the through-wafer conductor.

48. The method of claim 43 further comprising forming the conductive wafer as a composite wafer having a top layer and a bottom layer that are bonded together.

49. The method of claim 48 wherein the top layer and the bottom layer of the conductive wafer are directly bonded together without an intervening layer of material.

50. The method of claim 48 wherein the top layer and the bottom layer of the conductive wafer are directly bonded together with an intervening material that also serves as the stop material.

51. The method of claim 50 wherein the intervening material is the oxide layer formed on one of the top layer or the bottom layer of the conductive wafer.

52. The method of claim 43 wherein the conductive wafer is a doped silicon wafer having a top section and a bottom section which have different doping levels.

53. The method of claim 43 wherein the providing the stop material comprises oxidizing the first portion of the patterned trench to form a stop layer on a bottom of the first portion of the patterned trench to define the stop position.

54. The method of claim 43 further comprising adding a dielectric material in at least one of the first portion of the patterned trench or the second portion of the patterned trench.

55. The method of claim 43, wherein at least a portion of the patterned trench is further fine-patterned within a trench opening with open passages interlined with lines of unremoved conductive wafer material.

56. The method of claim 55 further comprising adding a filler material between the lines of unremoved conductive wafer material.

57. The method of claim 55 further comprising oxidizing the lines of unremoved conductive wafer material.

58. The method of claim 43 wherein the forming the first portion of the patterned trench and the second portion of the patterned trench comprises forming a plurality of patterned trenches, each patterned trench having the first and second portions.

59. The method of claim 58 wherein the plurality of patterned trenches are arranged side-by-side in an array with neighboring patterned trenches sharing a common trench side.

60. The method of claim 58 wherein the plurality of patterned trenches are arranged side-by-side in an array with neighboring patterned trenches separated by an intervening spacing.

61. The method of claim 60 wherein the intervening spacing is occupied by a conductive material for decoupling neighboring conductors.

62. The method of claim 61 wherein the conductive material in the intervening spacing comprises unremoved conductive material of the conductive wafer.

63. The method of claim 43 wherein the conductive wafer is a conductive silicon wafer, and the providing the stop material comprises:
   forming an enlarged cavity at a bottom of the first portion of the patterned trench by isotropic silicon etching; and
   forming the stop material by oxidizing a bottom surface of the enlarged cavity to define a stop layer.

64. A method for fabricating through-wafer interconnects in a microelectronic structure, the method comprising:
   providing a conductive wafer having a front side and a backside;
   forming a patterned trench in the conductive wafer by removing material of the conductive wafer from at least one of the front side or the backside, wherein the patterned trench has an annular circumferential opening dividing the conductive wafer along the opening into an inner portion and an outer portion, such that the inner portion of the conductive wafer is located within the annular circumferential opening and insulated from the outer portion to serve as a through-wafer conductor; and
   adding a filler material into the patterned trench to maintain the through-wafer conductor within the annular circumferential opening during at least one subsequent fabricating step.

* * * * *